United States Patent [19]

Schaefer et al.

[11] 3,996,455
[45] Dec. 7, 1976

[54] TWO-DIMENSIONAL RADIANT ENERGY ARRAY COMPUTERS AND COMPUTING DEVICES

[75] Inventors: David H. Schaefer, Silver Spring; James P. Strong, Upper Marlboro, both of Md.

[73] Assignee: The United States of America as represented by the Administrator of the National Aeronautics and Space Administration, Washington, D.C.

[22] Filed: May 8, 1974

[21] Appl. No.: 468,614

[52] U.S. Cl. ............................. 235/152; 250/227; 340/172.5; 350/96 R
[51] Int. Cl.² .................................... H03K 19/14
[58] Field of Search .......................... 235/156, 152; 340/172.5; 350/96 R, 96 B, 96 C, 96 WG, 160 R, 160 LC; 250/227; 330/59

[56] References Cited
UNITED STATES PATENTS

| | | | |
|---|---|---|---|
| 3,270,187 | 8/1966 | Fomenko | 235/152 |
| 3,680,080 | 7/1972 | Maure | 235/152 X |
| 3,728,521 | 4/1973 | Borough et al. | 250/227 X |
| 3,777,154 | 12/1973 | Lindsey | 250/227 |
| 3,795,433 | 3/1974 | Channin | 350/96 WG |
| 3,871,743 | 3/1975 | Fulenwider | 350/96 C X |
| 3,880,452 | 4/1975 | Fields | 350/96 C |

*Primary Examiner*—David H. Malzahn
*Attorney, Agent, or Firm*—R. F. Sandler; John R. Manning

[57] ABSTRACT

Two-dimensional digital computers and computer devices operate in parallel on rectangular arrays of digital radiant energy optical signal elements which are arranged in ordered rows and columns. Logic gate devices receive two input arrays and provide an output array having digital states dependent only on the digital states of the signal elements of the two input arrays at corresponding row and column positions. The logic devices include an array of photoconductors responsive to at least one of the input arrays for either selectively accelerating electrons to a phosphor output surface, applying potentials to an electroluminescent output layer, exciting an array of discrete radiant energy sources, or exciting a liquid crystal to influence crystal transparency or reflectivity. An image combiner/duplicator serves as an interface device for either converting two spaced apart input arrays to a combined input array or for converting an input array to two spaced apart output arrays. Interconnecting devices provide an output array having signal element digital states dependent on the states of non-corresponding input signal elements. Such devices include: a slider for translating the output array with respect to the input array; a twister for rotating the output array by a multiple of 90°; an interchanger of rows and columns; an inverter of row or column element order; a magnifier responsive to a subarray of an input array; a spiller device responsive to the state of a single input element; a contractor device having an output signal element responsive to a digital 1 of any input element; a sweeper device for producing redundant rows or columns corresponding to a single input row or column. Memory devices utilizing the gates in conjunction with regenerative feedback also serve to threshold analog images. An A/D converter system converts an analog input image into bit planes. An array computer system organization includes array mask gating for performing different operations simultaneously on different image portions.

63 Claims, 46 Drawing Figures

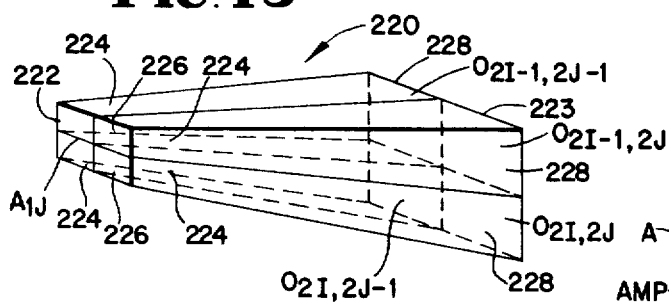
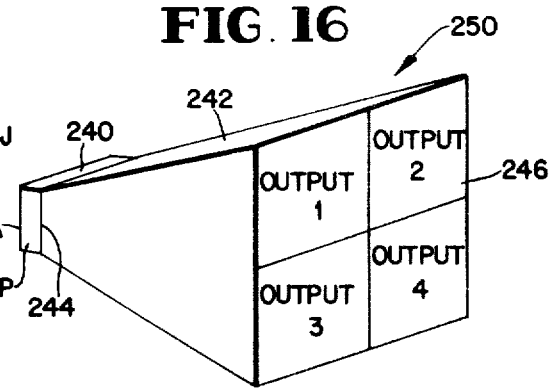
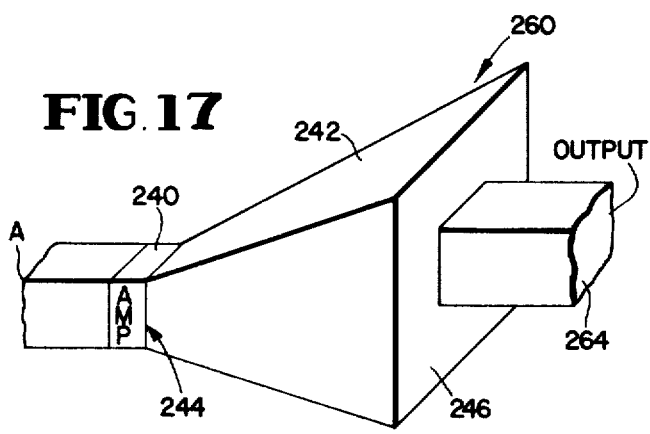
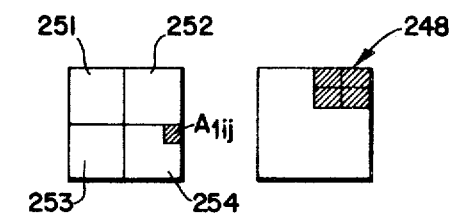
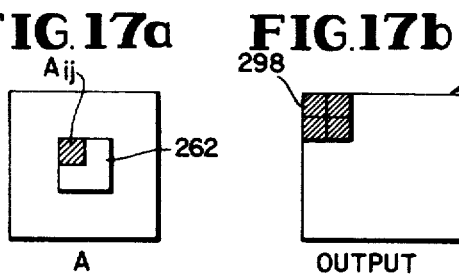
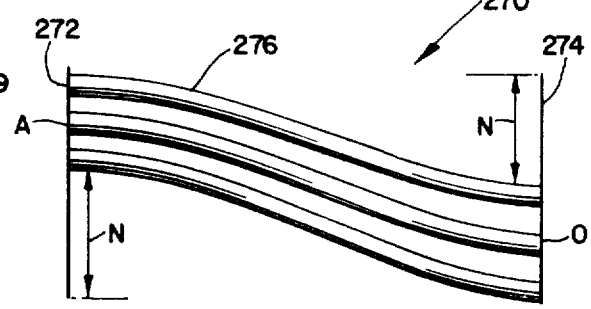
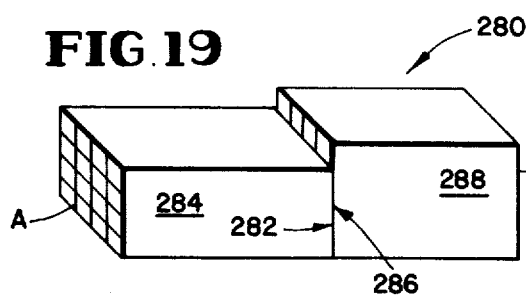
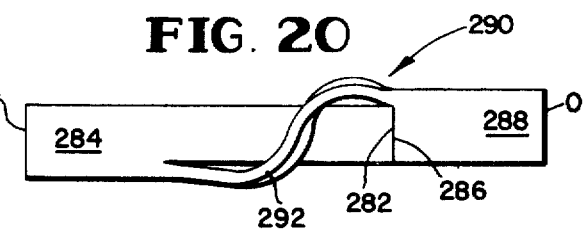
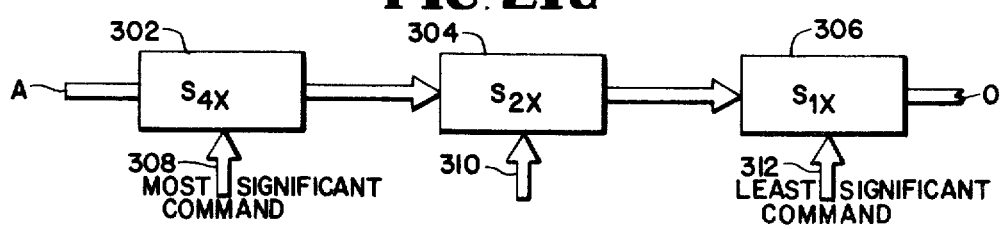

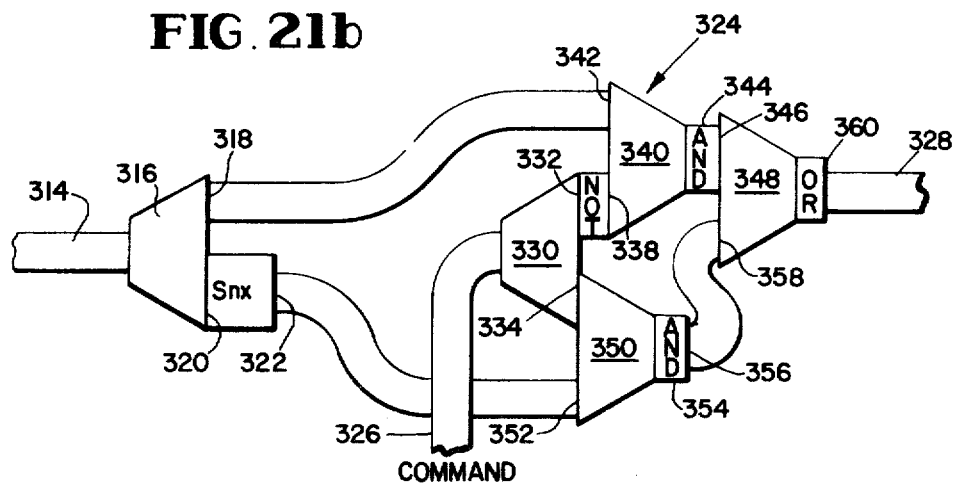
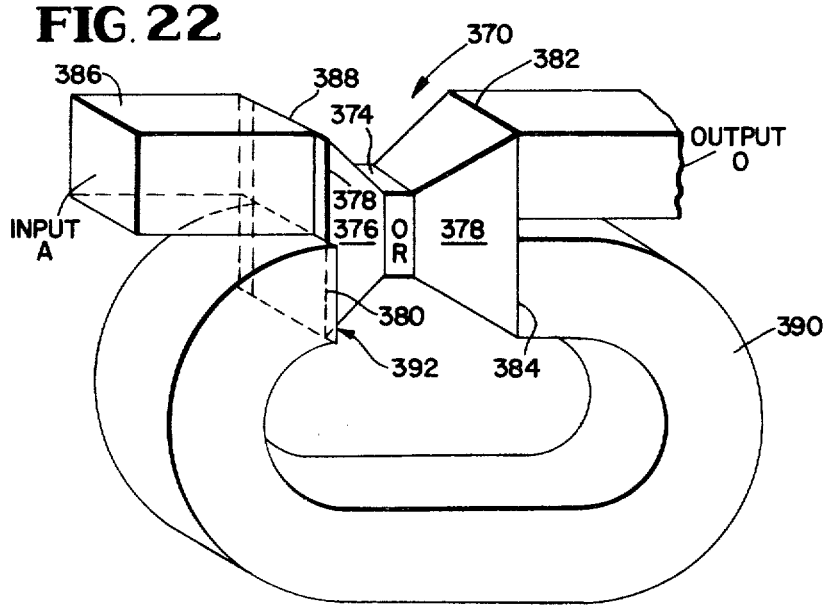
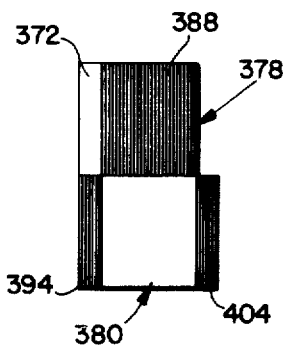
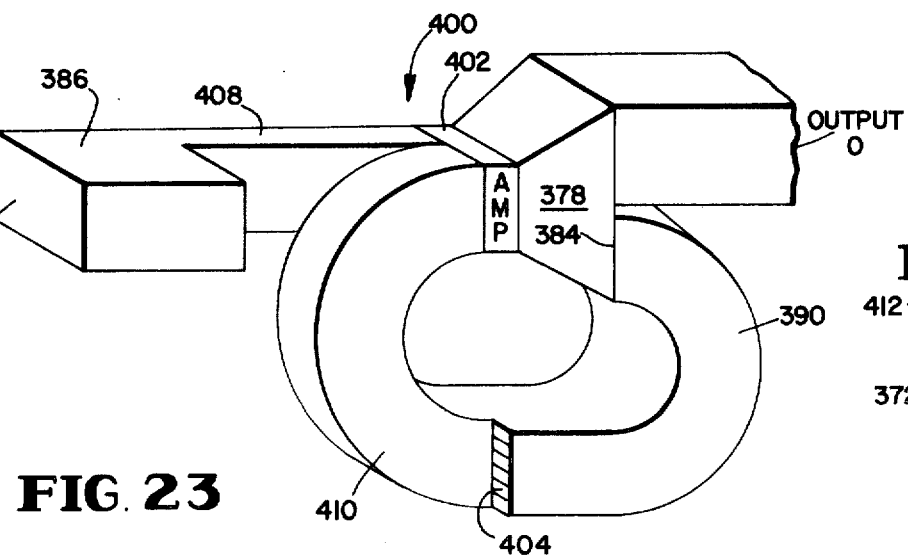
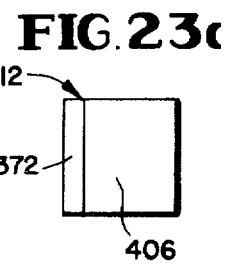

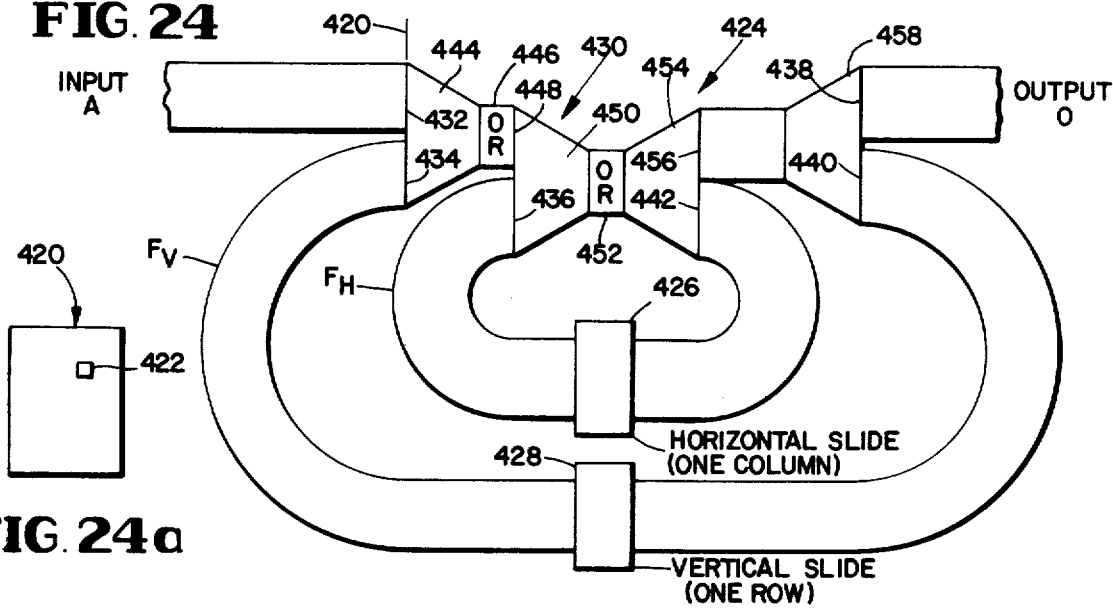
FIG. 24
FIG. 24a
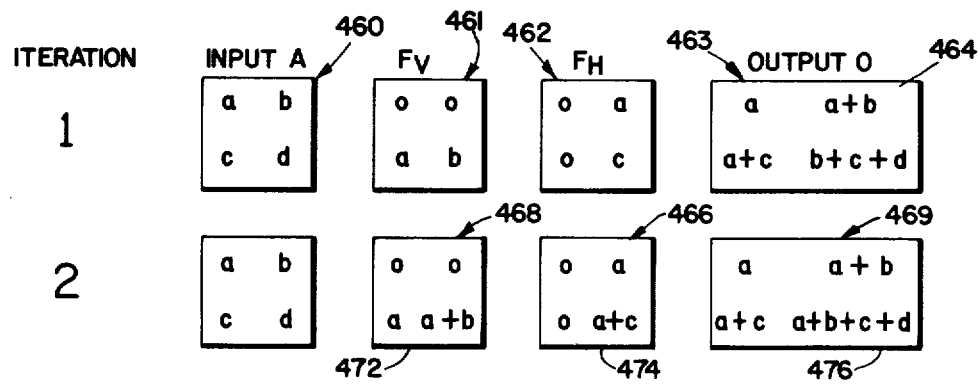
FIG. 24b
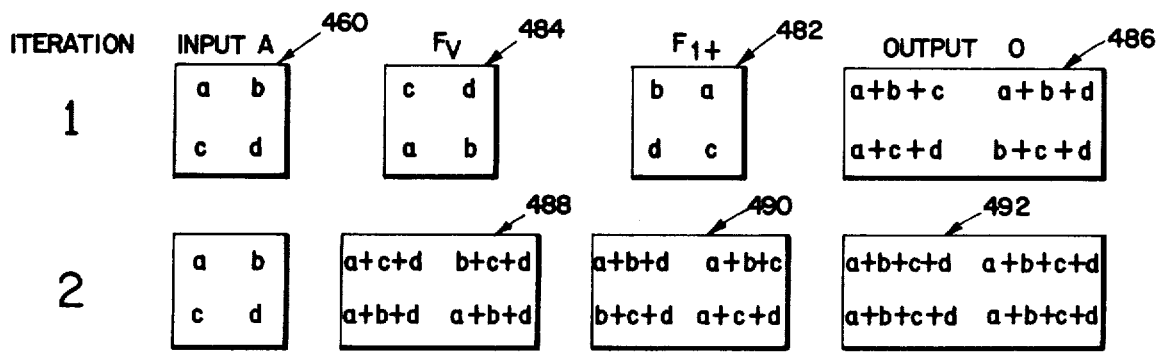
FIG. 24c

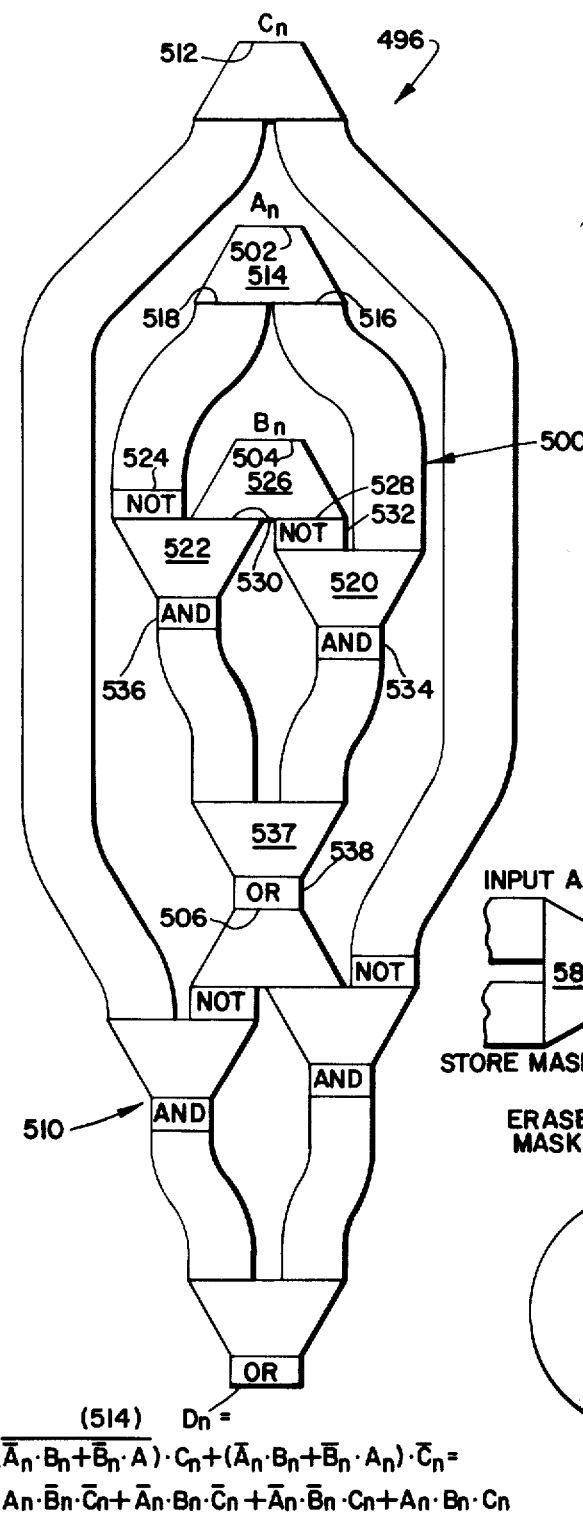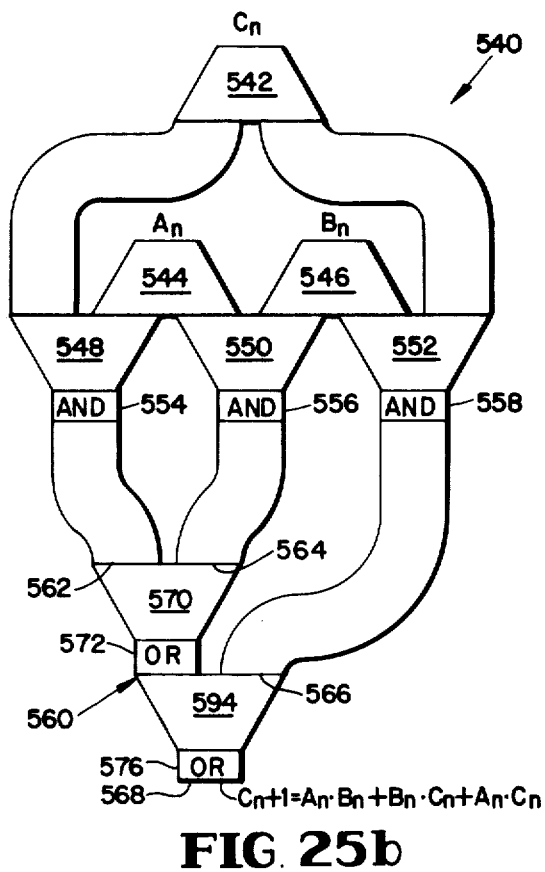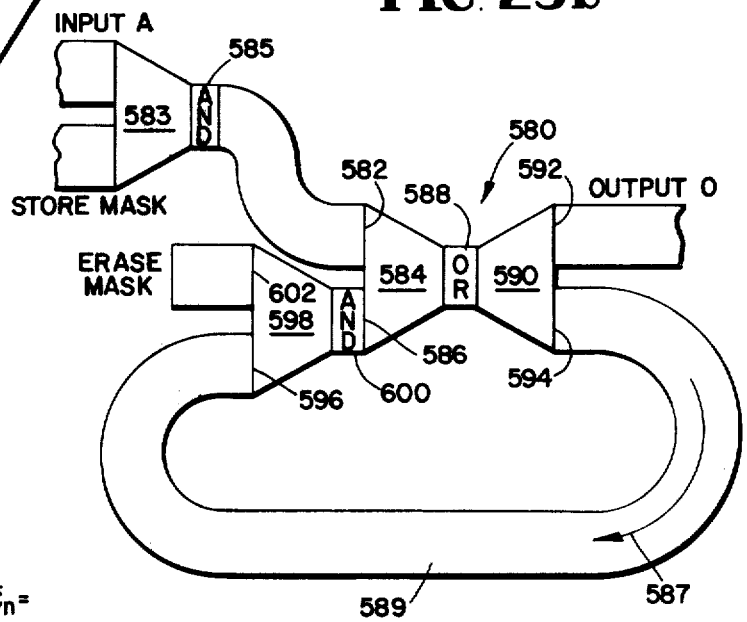
$$(514) \quad D_n = \overline{(\overline{\overline{A}_n \cdot B_n + \overline{B}_n \cdot A}) \cdot C_n + (\overline{A}_n \cdot B_n + \overline{B}_n \cdot A_n) \cdot \overline{C}_n} =$$
$$A_n \cdot \overline{B}_n \cdot \overline{C}_n + \overline{A}_n \cdot B_n \cdot \overline{C}_n + \overline{A}_n \cdot \overline{B}_n \cdot C_n + A_n \cdot B_n \cdot C_n$$
FIG. 25a
$C_{n+1} = A_n \cdot B_n + B_n \cdot C_n + A_n \cdot C_n$
FIG. 25b
FIG. 26

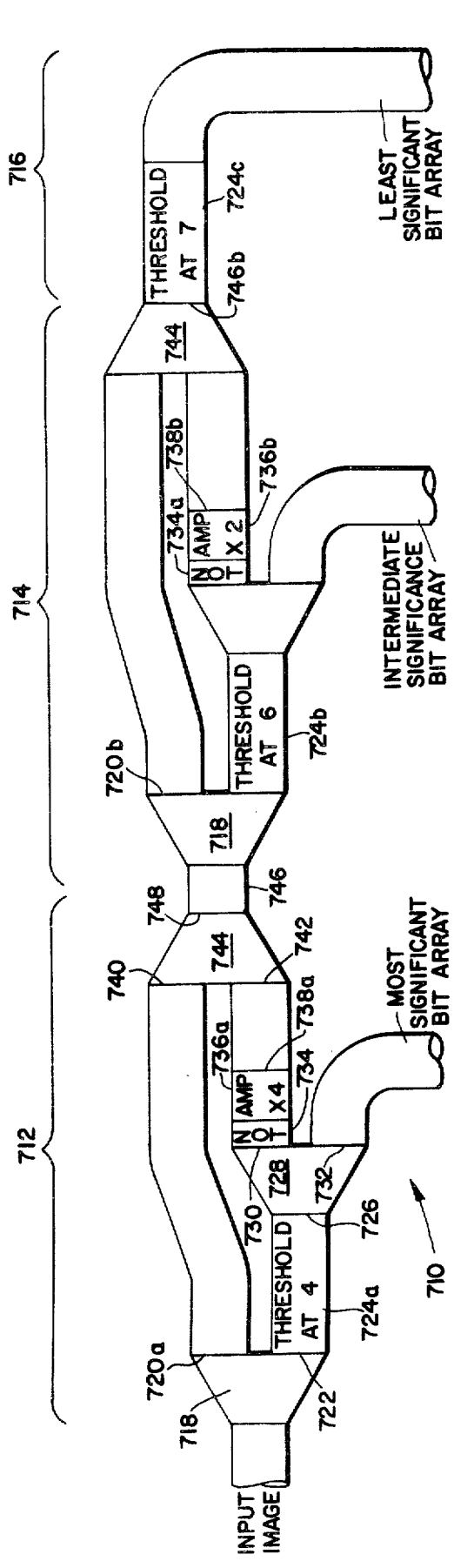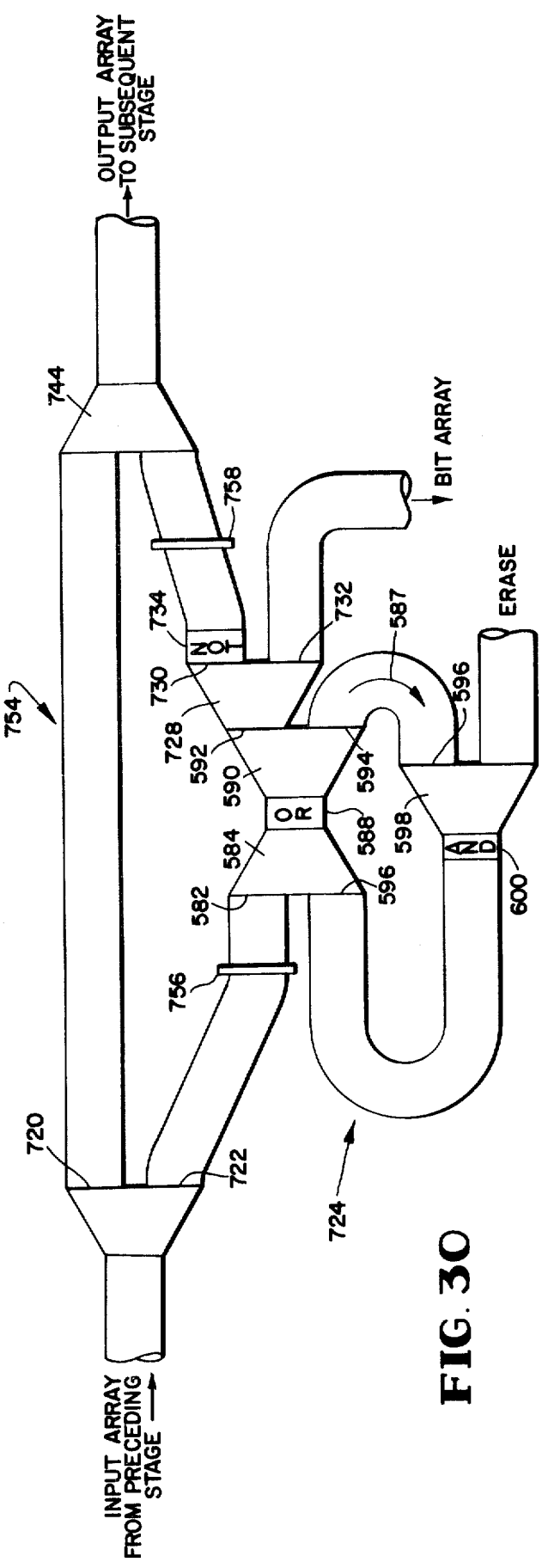
FIG. 29
FIG. 30

TWO-DIMENSIONAL RADIANT ENERGY ARRAY COMPUTERS AND COMPUTING DEVICES

ORIGIN OF THE INVENTION

The invention described herein was made by employees of the United States Government and may be manufactured and used by or for the Government for governmental purposes without the payment of any royalties thereon or therefor.

FIELD OF THE INVENTION

The present invention relates to digital computers and computing devices including arrays of radiant energy signal sources.

BACKGROUND OF THE INVENTION

Conventional digital computers are composed of devices which perform logical operations on one-dimensional electrical binary signals. Such conventional digital computers are used to process large two-dimensional image or array data only with great difficulty since, in general, point-by-point scanning or interrogation of the images or arrays is required to convert the image data to a serial data stream suitable for digital computer processing. While devices having an optical array radiant energy input and an optical array output, such as image intensifiers, have been available for some time, to our knowledge no devices have heretofore existed having digital radiant energy array inputs and deriving a digital radiant energy array output according to desired logical operations.

The impetus toward development of two-dimensional digital computing devices and systems has come from the orders of magnitude of speed advantage which can be obtained by processing the one million or more picture elements of satellite gathered earth observations imagery in parallel. In particular, the speed advantages may permit such computers to be carried on board future weather and natural resource observation satellites. Furthermore, two-dimensional computers have a broad application for many problems not related to real images throughout the various scientific disciplines where large order two-dimensional array data is to be processed.

OBJECTS OF THE INVENTION

It is an object of the present invention to provide a two-dimensional digital computing machine and digital computing devices therefor.

It is a further object of the present invention to provide devices for performing logical operations on arrays of radiant energy signals.

It is yet another object of the present invention to provide a computer system for operating on array data with the ability to simultaneously perform different operations with respect to different array elements.

It is another object of the present invention to provide devices for manipulating the positions of signal elements of an input radiant energy array.

It is a further object of the present invention to provide a means for interfacing two-dimensional logic devices.

It is another object of the present invention to provide a memory device for two-dimensional radiant energy signal arrays.

It is yet another object of the present invention to provide an analog to digital converter for converting an analog signal array to arrays of digital signals.

It is yet another object of the present invention to provide devices having two-dimensional output arrays responsive to only a portion of an input radiant energy signal array.

SUMMARY OF THE INVENTION

Two-dimensional logic devices for two-dimensional digital computing machines may be viewed in some respects as two-dimensional extensions of conventional logic devices. Thus gate devices analogous to AND, OR, NAND, NOR and exclusive OR (XOR) accept two input spaced apart arrays of signals, each having ordered rows and columns and in effect perform the logic operations on each pair of signals of the input arrays at the same row and column position within each array to derive an output array of signals.

The output array is also arranged in ordered rows and columns with each signal thereof derived from the input elements at corresponding row and column positions. As should be apparent if every device of a conventional computer were replaced by an array of wired devices, one would obtain an array of independent computers each characterized by a different row and column position within the various arrays. However, as distinguished from such a hypothetical situation according to the present invention devices characterized as interconnecting devices are provided wherein the device digital output signal at any given row and column position is dependent upon the digital state of at least one input signal at a non-corresponding row and column position.

The two-dimensional gates of the present invention rather than receiving and transmitting electrical signals via wires receive and transmit arrays of digital radiant energy signals such as a two intensity level (e.g. black and white) optical image. The term "radiant energy" is also intended to include other forms of electromagnetic radiation such as microwave as well as wave-like or particle-like radiation, for example X-rays and electron beams. Radiant energy provides a format where radiation and particle imaging techniques are used to convey the radiant energy array output of one gate to the radiant energy array input of another gate via lenses, conduits, etc. When the radiant energy is optical, optical lenses or fiber optic bundles are used.

According to the present invention, one type of logic gate for receiving two digital optical signal arrays or images includes an array of pairs of photo-responsive elements such as photoconductors which are interconnected in series for "AND" type logic functions and in parallel for "OR" type logic functions with a source of voltage to form an array of photoconductor circuits responsive to corresponding elements of the input arrays. An electrical digital signal array is derived by these photoconductor circuits indicative of the result of the intended logic operations on corresponding input array signal elements. This electrical signal array which appears on a suitable electrode array is transduced to an output digital optical signal array by either selectively accelerating electrons to a phosphor, exciting an electroluminescent material or by driving an array of discrete light sources such as light emitting diodes.

In another type of logic gate which receives two digital optical signal arrays, a single array of photoconductors is provided responsive to only one of the input signal arrays. The photoconductors are connected to a voltage source and an electrode array. Electrical digital signals on the electrode array, which are indicative of he digital state of only one input array are used to excite a liquid crystal to selectively influence the crystal transparency or reflectivity to the other input array of digital optical signals. In different embodiments, the output digital optical array is taken as either that optical energy of the other array which is transmitted through or that optical energy reflected from the liquid crystal.

Digital state inverting logic gates are mechanized by either replacing the photoconductors with suitable phototransistors or by situating the electrode array driven by the photoconductor circuits in a position to act as a selective shield or grid between a voltage source and the electrical to optical transducer.

An interface device for the gates serves both as a combiner and a duplicator. As a combiner the device receives two spaced apart optical digital signal arrays and transmits a combined output digital signal array wherein input signals of the two arrays at corresponding row and column positions are neighbors in the combined output array. The photoconductor arrays of the two-array input gates are arranged in a similar combined array to receive the combiner output.

As a duplicator the interface device receives an input digital optical array at the surface used for output in the combiner mode and produces two spaced apart duplicate digital optical output arrays at the surface or surfaces used for input in the combiner mode. The device works both as a combiner and duplicator by the manner in which the signal conduits are arranged. The two-array-input gates have an output surface and an input combined array. By having the apertures positioned and sized to encompass both corresponding neighboring input apertures of the combined array surface, the use of the same interface device as either a combiner or a duplicator is enabled.

The interconnection devices transmit digital signal arrays derived from non-corresponding digital signals of the input array.

One such device is termed a "slider". Therein conduits are connected between input and output surfaces so that the output area is slid in horizontal or vertical a predetermined number of rows or columns respectively. Sliders are classified as either linear or cyclical. An example best illustrates the concept. Assume a near horizontal slide of 2 is performed on an input square signal array containing 16 elements, 4 rows and 4 columns. The output array is also 4 × 4 square but is such that the first two columns of the output array are blanks, and the third and fourth columns of the output array are respectively the same as the first and second columns of the input array. Thus, in a linear horizontal slide of two, two input columns do not appear in the output array and two output array columns are blank. In a cyclical slide of two, the columns which would be lost in a linear slide are recirculated into the positions which would be blank. Thus the first and second columns of the output array respectively are the same as the third and fourth columns of the input array.

Linear sliders with binary coded ($2^n$) slide values may be combined with logic gate devices to slide an input array an arbitrary amount.

Another interconnection device is a row or column inverter. In one mechanization of a row inverter the combiner/duplicator functions both as a combiner and duplicator with a mirror facing the combined array surface. The input array is applied at one of the spaced apart array locations, and the mirror image thereof is formed at the other spaced apart array location. This mirror image is received by a conduit bundle having a 180° bend.

Another interconnection device comprises a conduit bundle which is twisted a multiple of 90° about the bundle axis. The combination of a row or column inversion and an appropriate 90° twist is a "transpose".

Still another interconnection device is a "magnifier". Therein an array of tapered conduits converts a subarray of the input array to a properly sized output array having subarrays with redundant digital states corresponding to the signal states of the subarray portion of the input array.

Another interconnection device is termed a "sweeper". A horizontal sweeper is such that a predetermined column (such as the leftmost of the input array) is swept or streaked to form an output signal array composed of redundant corresponding columns. A vertical sweeper is similar with respect to rows. Sweepers may be mechanized using an appropriate slider in an OR gate feedback path, and by masking all of the input array but the predetermined row or column.

Another interconnection device is termed a "contractor". Therein either a predetermined element of the output array or the entire output array is digital one if any of the input signal array elements is digital one. Contractors are essentially combined horizontal and vertical "sweepers". Utilizing horizontal and vertical cyclical sliders in parallel feedback paths yields an all digital one output array if any input array element is digital one while utilizing linear sliders yields an output array in which each signal element residing in the ordered rows and columns of the output array is the result of ORing together all signals residing in the same and lower ordered rows and columns of the input array. Thus the signal element in the highest order row and column is the OR of all the elements of the input array.

Another interconnection device termed a "spiller" is defined as having an output of redundant array signal elements having the same state as a single predetermined input signal element. A "spiller" may be mechanized by masking off all but the predetermined input signal element and applying only said signal element to a suitable "contractor".

Memory devices for radiant energy digital arrays are built of the logic gate devices and incorporate regenerative digital feedback excited by one digital state of a data array. Erase or clock array inputs are provided and may be responsive to masks for selectively erasing or storing portions of data images. One memory disclosed is analogous to a gated R/S flip-flop. Such flip-flops may be arranged in a counting chain. Counting masks and set mask inputs are provided for setting selective portions of array data and for counting only in selected portions of said array data.

Since the memory devices use regenerative feedback they are useful as thresholding devices since the feedback tends to enhance any amplitude dependent nonlinearity. Thresholding devices form the heart of an A/D converter system for converting an analog input image into a plurality of digital arrays, one for each bit of significance.

A computer system utilizes the logical devices in an arithmetic unit and the memory devices in a memory unit and assorted registers. An instruction register cooperates with an instruction decoder and memory address decoder. The instruction register may contain radiant energy arrays indicative of which data array elements are to be operated on by which devices of the arithmetic unit and which memory locations are to supply which data elements. Thus, there may be a different instruction and different memory addresses involved for each signal element of a data array.

The above and still further objects, features and advantages of the present invention will become apparent upon consideration of the following detailed description of several specific embodiments thereof, especially when taken in conjunction with the accompanying drawing.

BRIEF DESCRIPTION OF THE DRAWING

FIG. 15 is a schematic isometric view of a magnifier conduit bundle for one input signal element;

FIG. 16 is a schematic isometric view of one embodiment of a magnifier constructed of the conduit bundles of FIG. 15 having one input surface and four output surfaces;

FIG. 16a is an elevation view of the input surface of FIG. 16;

FIG. 16b is an elevation view of the fourth output surface of FIG. 16;

FIG. 17 is a schematic isometric view of another embodiment of a magnifier constructed of the conduits of FIG. 15 and having input and output surfaces;

FIG. 17a is an elevation view of the magnifier input surface of FIG. 17;

FIG. 17b is an elevation view of the magnifier output surface of FIG. 17;

FIG. 18 is a cross-sectional view of one embodiment of a linear slider;

FIG. 19 is a schematic isometric view of an alternate embodiment of a linear slider;

FIG. 20 is a side view of a cyclical slider which is similar to the linear slider of FIG. 19;

FIG. 21a is a schematic view of a system of sliders having a plurality of stages;

FIG. 21b is a schematic view of one of the stages of FIG. 21a;

FIG. 22 is a schematic isometric view of one embodiment of a "sweeper" employing "slider" feedback to an input surface;

FIG. 22a is a schematic front view of the input surface of FIG. 22;

FIG. 23 is a schematic isometric view of an alternate embodiment of a sweeper also employing slider feedback to an input surface;

FIG. 23a is a schematic front view of the input surface of FIG. 23;

FIG. 24 is a schematic isometric view of a "contractor" utilizing sliders;

FIG. 24a is a front view of a mask for the input of the "contractor" of FIG. 24 to convert the "contractor" to a "spiller";

FIG. 24b is a chart of the states of the input, output and two intermediate arrays for successive iterations in the operation of the contractor of FIG. 24 where the sliders of FIG. 24 are linear sliders;

FIG. 24c is a chart similar to FIG. 24b where the sliders of FIG. 24 are cyclical sliders;

FIG. 25a is a schematic of an adder network for one bit plane for generating a sum bit plane;

FIG. 25b is a schematic of an adder network for one bit plane for deriving a carry bit plane;

FIG. 26 is a schematic view of one embodiment of a memory device utilizing digital feedback and responsive to an erase input;

FIG. 29 is a schematic view of an analog to digital converter composed of a plurality of stages;

FIG. 30 is a schematic view of one stage of an alternate embodiment of an A/D converter;

FIG. 32b is a schematic diagram of a memory data source responsive to the memory address decoder of FIG. 32a.

DETAILED DESCRIPTION OF THE DRAWING

Referring to FIGS. 1–7, two-dimensional logic array devices are provided responsive to spaced apart radiant energy optical digital signal arrays A and B. Arrays A and B are generally rectangular, although usually square, and have digital optical signal elements $A_{IJ}$ and $B_{IJ}$ arranged in ordered rows and columns. The subscripts I and J refer respectively to the row and column of each element location within the respective arrays. By digital optical signals is meant that the optical signals of the arrays have two amplitude level states in correspondence with two digital states. A convenient pair of amplitude levels is such that optical energy is either present or absent at a given position corresponding with an element; the presence of optical energy corresponds to a digital one state and the absence of optical energy corresponds to a digital zero state.

The logic array devices perform a desired logic operation on corresponding signals of the input arrays A and B to form an output array O which is also arranged in ordered rows and columns.

By performing logic operations on corresponding signals of the input arrays A and B, it is meant that the logical state of signals residing for example at the third row and second column in array A and array B are combined to determine the logical state of the signal residing in the third row and second column of the output array O, according to some logical rule such as OR, AND etc. Thus, each signal at a given row and column position, $O_{IJ}$, has a digital state dependent only on the digital states of the input elements $A_{IJ}$ and $B_{IJ}$ at the same row and column position.

Figure 11:
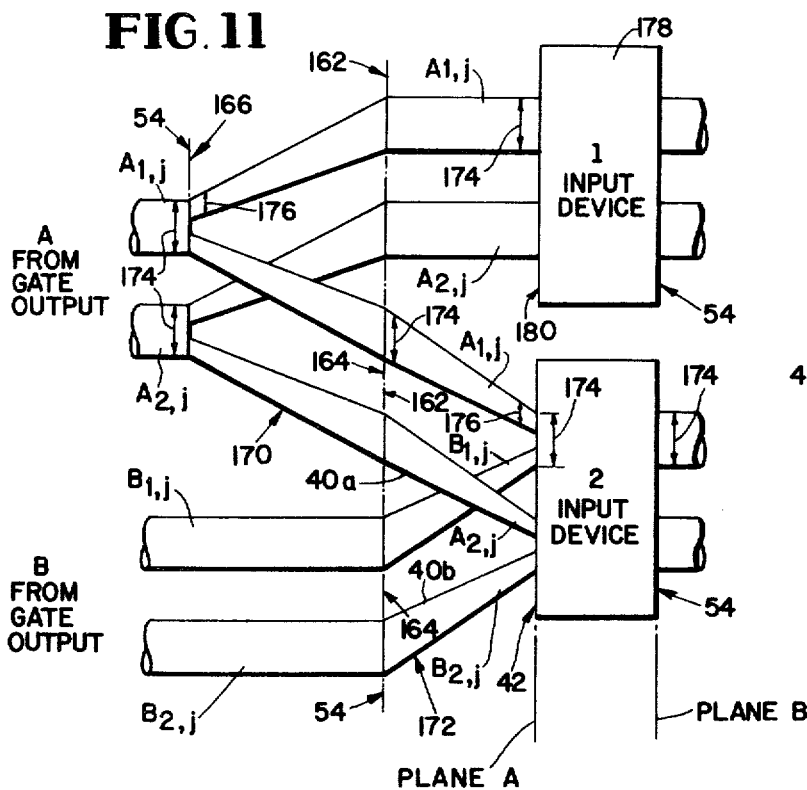
FIG. 11 is a schematic side view of a system employing two combiner/duplicators, one as a combiner and one as a duplicator in conjunction with a two-input gate device.
Figure 11A:
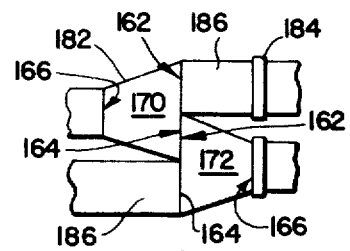
FIG. 11a indicates symbols used to describe FIG. 11.
Figure 11B:
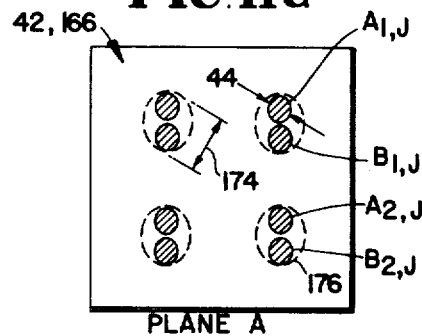
FIG. 11b is a view of the input surface of the two-input gate device.

The input signal arrays in effect correspond to optical digital images which may be conveyed to and from the logic devices by imaging optics such as lenses. By way of example, the input images appearing at input arrays A and B are respectively conveyed by interleaved fiber optic bundles 40a and 40b to insure proper registration of corresponding elements of the input images. As will be further understood from the discussion infra, in response to pairs of corresponding elements of the input arrays A and B, grouped together by the interleaving of the fiber optic bundles 40a and 40b, there is formed an output array O on an output face 54 of the device. Each of the logic devices therefore has a combined array input surface 42, as best shown in FIG. 11B, wherein the corresponding elements $A_{IJ}$ and $B_{IJ}$ are neighbors. As further indicated in FIG. 11b the neighboring corresponding elements $A_{IJ}$ and $B_{IJ}$ may be arranged one above the other and comprise a set 44. The combined array surface 42 is therefore an array of the sets 44 having the same row and column positions as corresponding elements appearing at input arrays A and B. Each output $O_{IJ}$ is derived from its corresponding set.

The logic devices of FIGS. 1–7 further include at least one photoconductor array of rows and columns made up of individual photoconductor elements 46, 50 responsive to the input array A wherein each photoconductor element at a given row and column position is responsive to the optical signal element $A_{IJ}$ at that row and column position.

Figure 1:
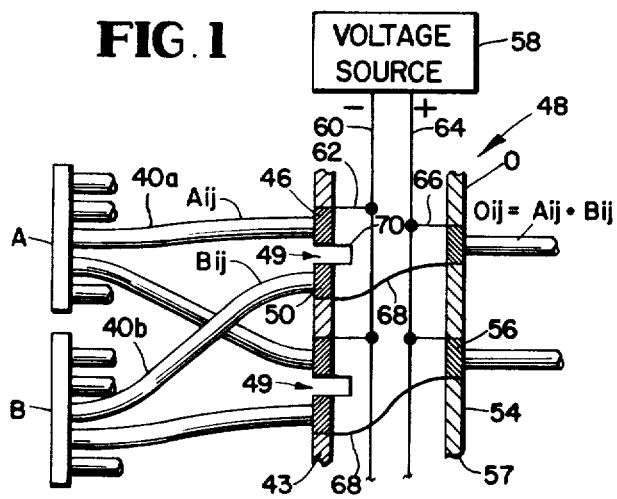
FIG. 1 is a schematic cross-sectional view of a part of a two-dimensional gate device employing an output array of discrete light sources.
Figure 11C:
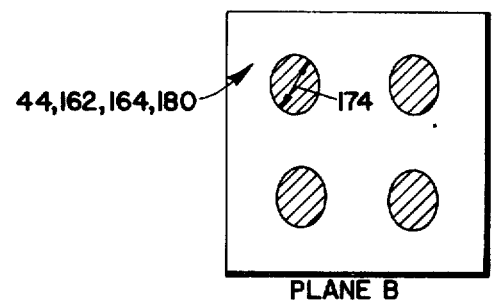
FIG. 11c is a view of the output surface of the two-input gate device.

In FIG. 1, one embodiment of an AND gate device 48 is illustrated. AND gate device 48 comprises a combined array receiving surface 42 having a combined array of photoconductor elements arranged on a single substrate 43 in a manner to be responsive to each of the input sets 44. There is a photoconductor element 46 responsive to each input signal $A_{IJ}$. Since, as previously discussed, input set 44 is made up of input elements from both input arrays A and B, there is also a photoconductor element 50 responsive to each input signal $B_{IJ}$. Thus, individual corresponding photoconductor elements 46 and 50 are also arranged next to one another in an array that is in correspondence with the sets 44. The AND gate device 48 also has an output surface 54 having an array of discrete light sources 56 activated by corresponding electric signals controlled by the photoconductor elements 46 and 50; sources 56 are preferably light emitting diodes. Light emitting diodes 56 are carried by a substrate 57 which is disposed parallel to and opposite substrate 43 and the diodes are arranged in ordered rows and columns as best illustrated in FIG. 11C. Corresponding input photoconductor elements 46 and 50 and output light emitting diodes 56 are connected in series circuits 49 with a voltage source 58 whereby the light emitting diodes 56 are energized with voltage and consequently emit light only if both corresponding photoconductor elements 46 and 50 are driven into conduction by light impinging thereon to selectively complete the electrical series circuits 49.

Figure 2:
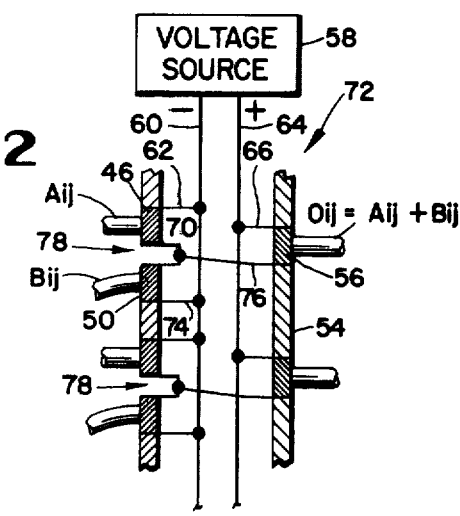
FIG. 2 is a view similar to FIG. 1 of a two-dimensional OR gate device employing similar output light sources.
Figure 3:
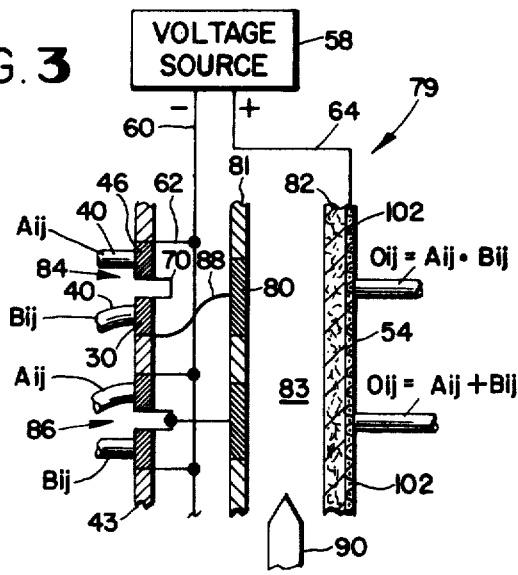
FIG. 3 is a view similar to FIG. 1 showing in different parts thereof an alternate embodiment of a two-dimensional AND gate device and OR gate device employing a phosphor output screen.

In FIGS. 1–3, opposed pairs of conducting electrodes are disposed on the top and bottom of photoconductor elements 46 and 50. One electrode of each of the photoconductor element 46 is connected to a planar voltage bus 60 from source 58 via leads 62. Also, one electrode of each of the light emitting diodes 56 is connected to a planar return voltage bus 64 via leads 66. The voltage busses 60 and 64 lie between the substrates 43 and 57. The other electrodes of the light emitting diodes are connected to one electrode of the photoconductor element 50 via leads 68 and the other electrodes of the photoconductor elements 50 and 46 are connected together by jumpers 70. The gate device 48 is thus seen to comprise an array of electrical circuits 49 responsive to corresponding input optical signals $A_{IJ}$ and $B_{IJ}$ whereby photoconductor elements 46 and 50 are selectively driven into conduction by the presence of optical energy, corresponding to digital one, from both $A_{IJ}$ and $B_{IJ}$ to complete the electrical circuits and excite the light emitting diodes 56 to thereby provide a corresponding digital output of $O_{IJ}$.

In FIG. 2 an OR gate device 72 is shown which is similar in construction to the AND gate device 48 except that corresponding photoconductor elements 46 and 50 are connected in parallel instead of series. Thus, light impinging on either or both of the photoconductor elements 46 and 50 completes an electrical circuit and activates the light emitting diode 56. As in FIG. 1, one electrode of the photoconductor element 46 is connected to the voltage bus 60 via leads 62 and one electrode of light emitting diodes 56 is connected to voltage return bus 64 via leads 66. However, the other electrode of the photoconductor element 50 is connected to voltage bus 60 via leads 74 and the jumpers 70 connecting photoconductor elements 46 and 50 are also connected to the other electrode of light emitting diodes 56 via leads 76. The OR gate device 72 may be seen to comprise an array of parallel circuits 78.

FIG. 3 illustrates an alternate gate device 79 utilizing an electrode array of electrode elements 80 arranged on a dielectric substrate 81 between the input substrate 43 and an output distributed light source phosphor screen 82 for selectively accelerating electrons to the phosphor screen. The device is suitably enclosed in a transparent envelope as of glass, not shown, to enable at least the space 83 between the electrode substrate 81 and the phosphor screen to be evacuated. For convenience, two different circuits 84 and 86 are illustrated in the device 79. Circuit 84 is a series circuit and corresponds to an AND gate device while circuit 86 is a parallel circuit and corresponds to an OR gate device. In circuit 84 one electrode of the series connected photoconductors is connected to accelerating electrodes 80 via leads 88 in order to conduct negative accelerating voltage thereto from source 58 when both photoconductors 46 and 50 are driven into conduction by input "digital one" optical energy. A filament 90 situated between the electrodes and the phosphor screen supplies electrons to the space 83. A transparent electrode 102, such as a grid or mesh, which is connected to the positive voltage side of source 58 via lead 64, maintains the phosphor screen at a positive potential. In the operation of gate device 79 the input digital optical signals $A_{IJ}$ and $B_{IJ}$ are converted to an electrical array of signals on electrodes 80. These electrical signals in turn are transduced to optical signals by the electron discharge device comprising the evacuated space 83 in which electrons are selectively accelerated to the phosphor screen 82.

Figure 4:
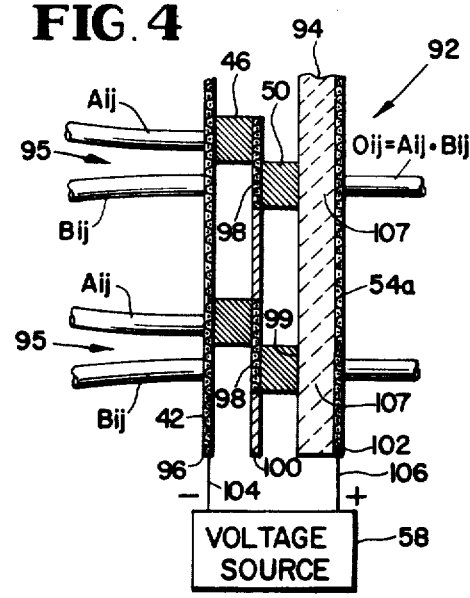
FIG. 4 is a view similar to FIG. 1 of an alternate embodiment of a two-dimensional AND gate device employing an electroluminescent output layer.

FIG. 4 illustrates an alternate AND gate device 92 utilizing a distributed light source electroluminescent output layer 94. Also illustrated is an alternate configuration of the series connection of photoconductor elements 46 and 50. Therein the photoconductor arrays are such that the corresponding photoconductor elements 46 and 50 are axially as well as vertically spaced. A rectangular array of photoconductor elements 46 is sandwiched between a first planar transparent electrode 96, the front surface of which is the combined array input surface 42, and an electrode comprising an array of spaced transparent conducting elements 98 bridge corresponding photoconductor elements 46 and 50. The bridging conducting elements 98 are carried by a dielectric substrate 100. Photoconductor array elements 50 are sandwiched between bridging elements 98 and the electroluminescent layer 94, with a photoconductor back surface 99 of layer 94 abutting photoconductor elements 50. A planar transparent electrode 102 is provided on the opposite side of electroluminescent layer 94 as an output surface. Planar transparent opposed electrodes 96 and 102 are connected to a suitable voltage source 58, as of 60 Hz a.c., by leads 104 and 106, respectively, for selectively activating the portions 107 of the electroluminescent layer 94 which abut the photoconductor elements 50. The transparent electrodes may be constructed of extremely thin metallic layers or very fine wire mesh. The AND gate array device 92 comprises a rectangular array of the series electrical circuits 95, each including the voltage source 58, the electrode 42, a photoconductor element 46, a bridging element 98, a corresponding photoconductor element 50, an electroluminescent layer portion 107 and the electrode 102. When both photoconductor element 46 is excited into conduction by a digital one optical signal $A_{IJ}$ passing through electrode 42 and the corresponding photoconductor element 50 is excited into conduction by a digital one optical signal $B_{IJ}$ passing through electrode 42 and bridging element 98 the electrical circuit is completed and the portion 107 emits light $O_{IJ}$ corresponding to a digital one output signal $O_{IJ}$.

Figure 5:
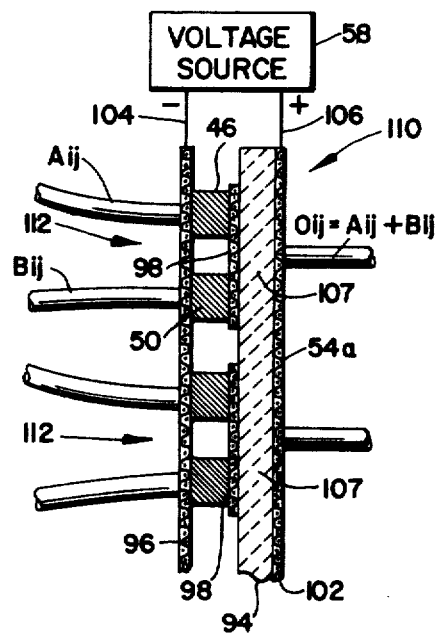
FIG. 5 is a view similar to FIG. 1 of an alternate embodiment of an OR gate device employing an electroluminescent layer.

In FIG. 5 is illustrated an alternate embodiment of an OR gate device 110 composed of an array of parallel circuits 112 for selectively activating portions 107 of electroluminescent layer 94. Therein corresponding photoconductor elements 46 and 50 are sandwiched in side-by-side relationship between the front transparent electrode 96 and a corresponding one of the array of bridging electrode conducting elements 98. The bridging elements 98, which are secured to the electroluminescent layer 94 as by deposition or with a suitable adhesive, define electroluminescent layer portions 107 between each of the bridging elements and the transparent back electrode 102. The portions 107 are selectively excited in the circuits 112 to emit output light signals $O_{IJ}$ when either a photoconductor element 46 is driven into conduction by an input digital one signal at $A_{IJ}$ or the corresponding photoconductor element 50 is driven into conduction by an input digital one signal at $B_{IJ}$.

Figure 6:
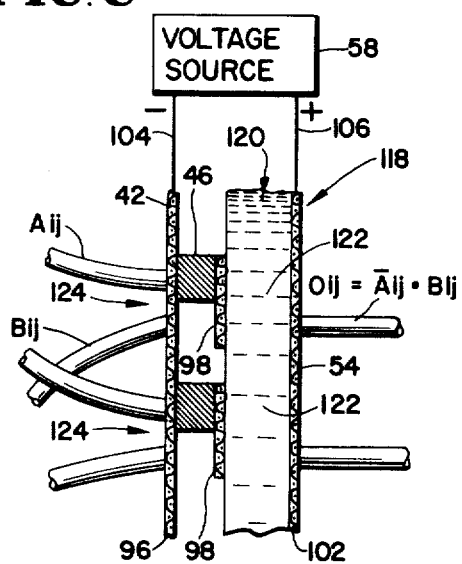
FIG. 6 is a view similar to FIG. 1 of a logic gate employing a liquid crystal for optical transmission.

FIG. 6 illustrates an alternate gate device 118 utilizing the transmission mode of a liquid crystal 120 which is contained in a suitable transparent glass envelope, not shown. As is well known the presence of voltage across a liquid crystal tends to make the crystal appear cloudy. When the crystal is cloudy, light is transmitted therethrough only with great attenuation and a significant amount of input light is also backscattered or reflected. In the gate device 118, a rectangular array of photoconductor elements 46, responsive to the rectangular array of input optical signals $A_{IJ}$, selectively controls the application of voltage from source 58 to portions 122 of the liquid in an array of circuits 124 to influence the transmission of the optical signals $B_{IJ}$ through the portions 122. The rectangular array of photoconductor element 46 is sandwiched between the transparent front planar electrode 96 and the array of transparent bridging electrode 98. The bridging elements 98, which are adhesively secured to the envelope of liquid crystal 120, define the crystal portions 122 between the bridging electrodes 98 and the back planar transparent electrode 102 which are in the transmission path of signals $B_{IJ}$. When photoconductors 46 are driven into conduction by light signals $A_{IJ}$, the circuits 124 are completed, exciting the liquid crystal portions 122 into a cloudy state wherein the light from $B_{IJ}$ which passes through the crystal to form the output signals $O_{IJ}$ is so attenuated as to be considered digital zero. Thus the output signal $O_{IJ}$ is digital one only if the input signal $A_{IJ}$ is digital zero (where the crystal is clear when free of voltage excitation) and the $B_{IJ}$ signal is digital one. Therefore the logic device may be represented by an AND gate device in combination with an inverter device for one of the inputs to the AND device.

Figure 7:
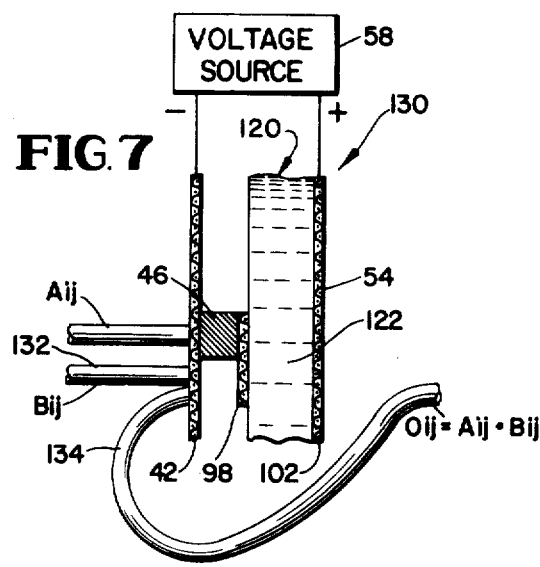
FIG. 7 is a view similar to FIG. 1 of alternate embodiment of a two-dimensional AND gate employing a liquid crystal for optical reflection.

The gate device 130 of FIG. 7 is an AND gate device which is identical in construction to the device of FIG. 6 except that the output signal is taken as that optical signal from $B_{IJ}$ which is reflected or backscattered from the liquid crystal portions 122. By conveying the incident signal $B_{IJ}$ by a fiber optic conduit 132 to the device input surface 42 and receiving the resultant signal reflected from the crystal 122 by conduit 134 adjacent conduit 132, direct signal coupling between $B_{IJ}$ and $O_{IJ}$ is avoided. Also it is possible to separate the incident signal $B_{IJ}$ and reflected signal $O_{IJ}$; with a partially reflecting, partially transmitting tilted half silvered mirror in a well known manner. In the operation of the AND gate device 130, when $A_{IJ}$ has digital one optical energy which causes the corresponding crystal portion 122 to be cloudy, and $B_{IJ}$ has digital one optical energy, a sufficient amount of the $B_{IJ}$ signal is received by conduit 134 to consider $O_{IJ}$ to be digital one.

Figure 8:
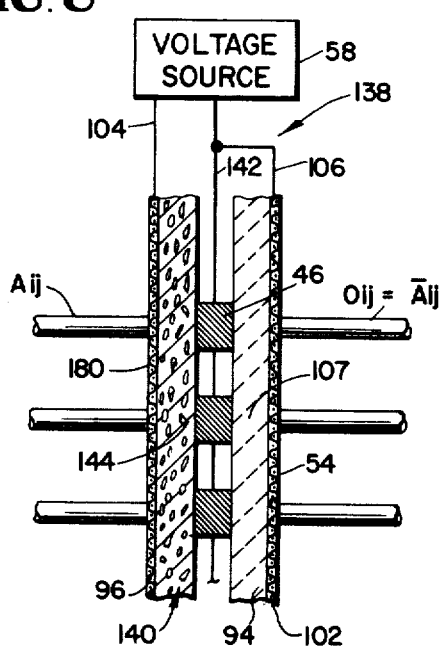
FIG. 8 is a view similar to FIG. 1 of an inverter utilizing a shield.

In FIG. 8 an inverter device 138 responds to a single input optical array of signals $A_{IJ}$ for forming output signals $O_{IJ}$ of the opposite digital states. Therein the rectangular array of photoconductor elements 46 is sandwiched between a transparent resistive layer 140 and a distributed electrically responsive light source ich as the electroluminescent layer 94. The transparent front and back electrodes 96 and 102 are respectively positioned at the front of the resistive layer 140 nd the back of the electroluminescent layer 94. A itable potential as of 60 Hz a.c. from source 58 impressed across the transparent electrodes via leads 104 nd 106 is chosen of sufficient strength to excite the ectroluminescent layer 94 to emit light when the notoconductor elements 46 are in a conducting state. notoconductor elements 46 are positioned in electrical contact with a mesh voltage bus 142 which is connected to the same side of voltage source 58 as is back anar electrode 102. Therefore when photoconductor ements 46 are driven into conduction by the impingent of digital one optical energy signal at $A_{IJ}$, electroluminescent layer portions 107 defined between the ack of a photoconductor element 46 and the back anar electrode 102 have no potential difference cross them. Consequently no light output is emitted, the potential of voltage source 58 instead appears cross portions 144 of the resistive layer defined between the front of a photoconductor 46 and the front ectrode 96. Thus only when $A_{IJ}$ is digital zero are ortions 107 excited to emit light. The photoconductor ement 46 when driven into conduction form a selective shield. Numerous other techniques, not illustrated, ay be used to make an inverter. For example the ectroluminescent layer may be replaced with the ectron acceleration space 83 and phosphor screen 82 of FIG. 3. Also an array of phototransistors may be sed in lieu of the photoconductor elements 46. For ample in any of the aforementioned two-input gate nbodiments, the photoconductor elements 46 and/or 0 may be replaced with suitable phototransistors to rm an element which electrically conducts only in the osence of the input light energy.

Figure 10:
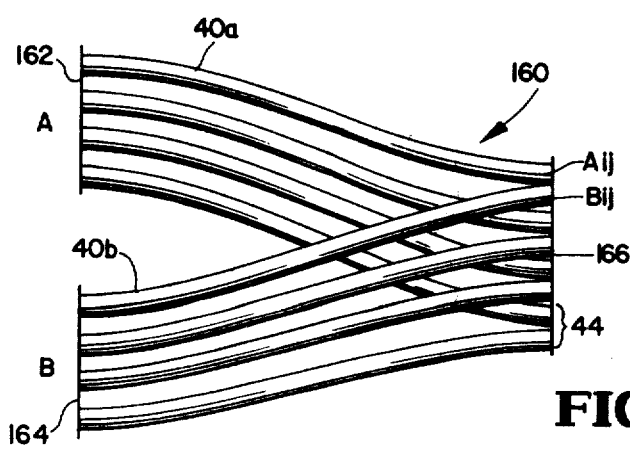
FIG. 10 is a schematic cross-sectional view of a combiner/duplicator.

The two-input gates described are conveniently produced as planar devices defined between the combined ray input surface 42 and the output surface 54, and e interleaved fiber optic input signal conduits 40a nd 40b are conveniently incorporated into the combining device 160 illustrated in FIG. 10. Therein, the ombining device 160 has an input surface 162 adapted ) abut the output surface 54 of one gate and a second iput surface 164 vertically spaced below surface 162 hich is adapted to abut the output surface 54 of a cond gate. The interleaved fiber optic conduits 40a nd 40b span respectively from the surfaces 162 and 64 to the combined array output surface 166 which is lapted to abut the input surface 42 of a two-input ate. The respective input signals to array surfaces 162 nd 164 at corresponding row and column positions are onveyed by the interleaved conduits 40a and 40b to eighboring locations to form the combined array of ts 44.

By appropriately choosing the relative areas encompassed by the radiant energy input and output signals of e two-input gates the combiner device 160 may be sed as a duplicator device as well. FIGS. 11, 11a, 11b nd 11c are illustrative. Therein, one combiner/duplicator device 170 is used in the duplicator mode and n oppositely facing combiner/duplicator device 172 is sed in the combiner mode. In the illustrated embodient the interleaved conduits 40a and 40b of the combiner/duplicator devices are tapered or frusto-conical serve as smooth transitions between a large diameter r aperture size 174 at surfaces 162 and 164 to a naller diameter or aperture size 176 at surface 166.

The apertures of photoconductor elements 46 and 50 at the gate input surface 42 are also of size 176, while the gates are so constructed that each output signal $O_{IJ}$ illuminates the entire aperture size 174. The sets 44 are arranged so that the neighboring corresponding two small apertures of size 176 are encompassed by the aperture size 174. Thus with a gate output surface 54 abutting the combiner/duplicator combined array surface 166 the gate output signal $A_{IJ}$ (which serves as an input signal to duplicator 170) from one large sized aperture 174 is directed into two neighboring small sized apertures (44) and thence to two interleaved conduits 40a and 40b. Therefore the input signal array A to combiner/duplicator 170 is duplicated at the two vertically spaced apart array surfaces 162 and 164.

The combiner 172 of FIG. 11 may receive inputs to spaced apart array surfaces 162 and 164 from a gate output surface 54 or a duplicator output surface 162 or 164. As should be apparent, "one-input" gates 178 such as the inverter 138 have input surfaces 180 having apertures of the same size as the gate output surfaces 54 in order to receive inputs from a duplicator output surface 164 or a gate output surface 54.

FIG. 11a illustrates the symbology which will be used throughout the later discussion. The combiner 170 and duplicator 172 are each represented by the trapezoids 182 with opposed short and long sides. The short side corresponds to the surface 166 while the top and bottom halves of the long side respectively correspond to the surfaces 162 and 164. The one and two-input gates are represented by the rectangles 184. An appropriate label within a rectangle 184 such as OR, AND, NAND, NOR, XOR, NOT will indicate the functional characteristics of the gate. Often it is not possible to directly abut gate surfaces and an array of fiber optic conduits of size 174 represented by the two parallel line image bus symbols 186 are used to couple gate surfaces. The various symbols are occasionally drawn as isometric figures to aid in illustrating the two-dimensional nature of the signal arrays being operated on.

Figure 9:
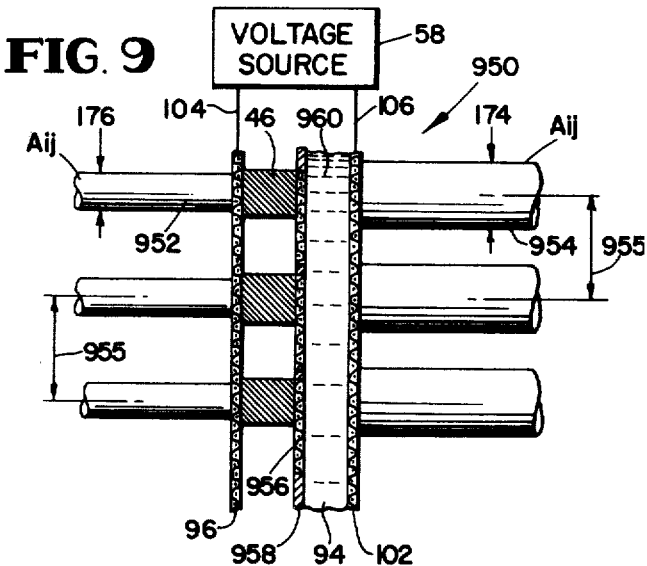
FIG. 9 is a schematic cross-sectional view of a two-dimensional device for reformatting radiant energy array signals.

As an alternative to forming combiners and duplicators of tapered interleaved conduits 40a and 40b, as illustrated in FIG. 11, the conduits may be formed of substantially constant cross-section interleaved conduits of size 174. In that event, when interfacing duplicator 170 output surface 162 (which would have small conduits or apertures) with one input gate 178, it is desirable to interpose the reformatter 950 of FIG. 9 between duplicator 170 and the input surface 180 to convert spaced apart conduits of size 176 to contiguous conduits of larger size 174.

Reformatter 950 serves as an amplifier and element size restorer for input array data conveyed to the reformatter on transversely spaced conduits 952 of small size 176. The output of the reformatter comprises an array of conduits 954 of size 174 wherein signals in output conduits 954 have the same digital state as signals in corresponding input conduits 952. The input and output conduits 952 and 954, respectively, though of different size are on the same center-to-center spacing 955 between adjacent conduits. Spacing 955 is chosen so that the sides of conduits 954 substantially abut each other. The reformatter 950 further comprises an array of photoconductor elements 46 having front faces illuminated by the radiant energy in individual ones of conduits 952 through a front transparent electrode 96. Abutting and extending parallel to the back forces of photoconductor elements 46 are planar electrodes 956 of size 176 carried by a substrate 958. Between substrate 958 and output transparent planar electrode 102 is sandwiched an electroluminescent layer 94. Voltage source 58 is applied between front electrode 96 and back electrode 102 so that electroluminescent layer 94 is selectively excited by the selective illumination of photoconductor elements 46 and the resultant selective conduction of voltage to the electrodes 956. Because the electrodes 956 are of size 174, the excited regions 960 of electroluminescent layer 94, defined between electrodes 956 and 102 are also of that size. The ends of output conduits 954 abut electrode 102 and are positioned along the electrode in alignment and light receiving relationship with regions 960.

Figure 12:
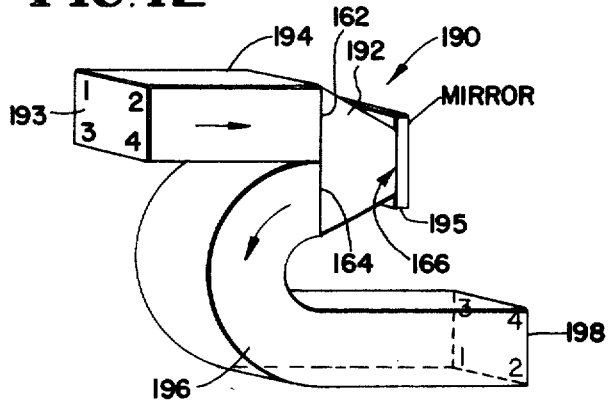
FIG. 12 is a schematic isometric view of a row inverter.

Interconnection devices are defined broadly as devices in which output signals $O_{IJ}$ exist which are not derived from corresponding input signals $A_{IJ}$. Although small signal arrays such as 2 × 2 are used to illustrate the operation of such devices, it is pointed out that the basic concepts are just as applicable to large signal arrays such as 1,000 × 1,000. One such device 190, termed a "row inverter", is schematically illustrated in FIG. 12. Device 190 utilizes a combiner/duplicator 192 as both a combiner and a duplicator. An illustrative input signal array 193 to the device, the elements of which are schematically identified by the numbers 1-4, is inputted to duplicator input surface 162 via image bus 194. A mirror 195 facing surface 166 reflects the input image and in effect causes its oppositely travelling duplication onto surface 164. A second image bus 196 abutting surface 164 is bent vertically 180° in a "U" shape to turn the direction of image travel around 180° so that the output image 198 carried by the bus 196 is travelling in the same direction as input image 193. The combination of taking the mirror image and providing an appropriate 180° conduit bend inverts the row locations of the signals 1-4. The signals 1 and 2 at the top row in the input array 193 appear at the bottom row at the output array 198 and so on. By providing a 180° bend of conduit 196 in the horizontal rather than vertical direction a column inversion is accomplished.

Figure 13:
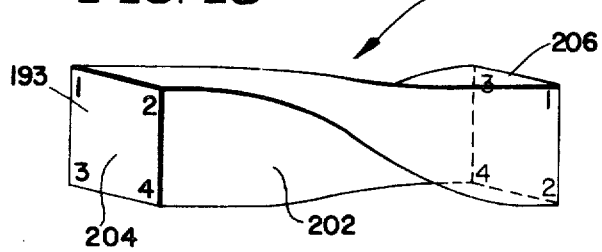
FIG. 13 is a schematic isometric view of a 90° twister.

In FIG. 13 a twist device 200 is illustrated wherein a conduit bus is twisted a multiple of 90° about its longitudinal axis 204. A clockwise 90° twist is illustrated. A counterclockwise 90° twist and a 180° twist will be also discussed. Therein the input signal array 193 has the position of the elements 1-4 transformed to form the output array 206 due to the twist. In effect by a 90° twist rows are transformed to columns and columns to rows. Thus the first row of signals 1, 2 of input array 193 is located in the last column of the output signal array 206. If instead there were a counterclockwise twist of 90°, the first column of input signals would fall in the last row of output signals. If instead there were a twist of 180° (the direction doesn't matter), the various diagonally opposed signal input elements such as 1 and 4 would exchange position in the output array.

The 90° twist is useful to convert a column inverter to a row inverter by first passing the input array 193 through a 90° twist of one sense, then through the row inverter and thereafter through a 90° twist of the opposite sense.

Figure 14:
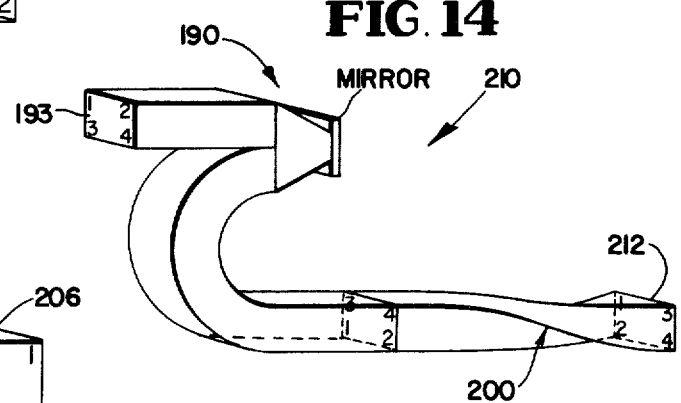
FIG. 14 is a schematic isometric view of a transposer.

As illustrated in FIG. 14 the combination of a row or column inverter followed by the proper sense 90° twist comprises a transpose device 210. The transpose operation is defined similar to its use in matrix algebra wherein each input located at a position $A_{IJ}$ in the input array 193 is located in position $O_{JI}$ in the output array 212.

Another interconnection device termed a "magnifier" is built of the tapered optical fiber units 220 shown in FIG. 15. Fiber unit 220 has a square input end 222 responsive to a single input element $A_{IJ}$ and a larger square output end 223 for deriving a plurality of identical output signals having the same digital state as $A_{IJ}$. Specifically, the illustrative embodiment of fiber optic unit 220 is such that a square array of four output signals $O_{2I-1, 2J-1}$, $O_{2I, 2J-1}$, $O_{2I-1, 2J}$ and $O_{2I, 2J}$ is derived. The fiber unit 220 is composed of a square array of four tapered optical fibers 224. The four fibers 224 have small cross-section input ends 226 which together form the fiber unit input end 222 and large cross-sections output ends 228 which together form the fiber unit output end 223. Fiber output ends 228 are each sized to transmit one output signal while input ends 226 are each sized to receive only a quarter of the area encompassed by input signal $A_{IJ}$. Thus the input signal $A_{IJ}$ is split into four equal parts, each part carried by a fiber 224 to produce the four equal output signals. Because of the four-way power split each output signal is one quarter of the amplitude of $A_{IJ}$ and an amplifier 240 (FIGS. 16 and 17) such as an image intensifier is required in order to introduce a gain of four either preceding or following fiber unit 220 to make each output signal equal to $A_{IJ}$.

In FIGS. 16 and 17 the fiber units 220 are stacked with the input ends 222 in a common plane to form a square pyramid 242 and the input array A is applied to the small input end 244 of pyramid 242 via amplifier 240. Thus the output end 246 of the pyramid 242 has four times as many signal elements as the input array and each element of the input array $A_{IJ}$ is reproduced on a square cluster of four output elements 248. An output array from surface 246 is taken of a size encompassing the same number of elements as A. Thus any output array is a "magnified" version of a square subarray of one quarter of the input signals $A_{IJ}$.

In the embodiment 250 in FIG. 16, four magnified output arrays (numbered 1-4) are derived respectively in response to the four input subarrays 251-254 produced by dividing the input array into four equal parts.

In the alternate embodiment 260 in FIG. 17, only a single output is provided which is a magnified version of a central square subarray 262 of the input A. The single output array is a corresponding central square array 264.

Another interconnection device is termed a "slider". One embodiment 270 of a slider is illustrated in FIG. 18. The embodiment 270 is illustrative of a linear vertical slide of a predetermined number "N". Slider 270 has two parallel opposed aligned input and output planar faces 272 and 274 respectively responsive to the input rectangular signal array A and for deriving output rectangular signal array O. Fiber optic conduits 276 connect elements $A_{IJ}$ of the input surface 272 to the vertically offset elements $O_{I+N, J}$ of the output surface which are vertically disposed "N" elements downward. As a result the first N rows of O and the last N rows of A have no connections to them. A linear horizontal slider is mechanized by connecting the elements $A_{IJ}$ to the horizontally offset elements $O_{I, J+N}$. Also, a vertical slider can be converted to a horizontal slide by placing ahead of the slider a 90° twist 200 (FIG. 13) of one sense and placing after the slider a 90° twist of the opposite sense.

FIG. 19 illustrates an alternate embodiment vertical slider 280 wherein the end 282 of a rectangular input array fiber-optic bus 284 abuts the end 286 of an output array bus 288. Buses 284 and 288 are vertically offset with respect to each other by the desired number of rows. The other end of buses 284 and 288 form the input and output surfaces.

FIG. 20 is a side view of a cyclical slider 290 which is identical in construction to linear slider 280 of FIG. 19 except that the rectangular subarray comprising the last N rows of A is connected to the rectangular subarray comprising the first N rows of 0 by an elongated rectangular image bus 292 which is brought around one side of image bus 284.

A linear slide of an arbitrary number of rows or columns is mechanized by cascading the slider units for binary coded amounts in the manner schematically illustrated in FIG. 21a. Assuming for the purpose of a simple example that the input signal array is a square array containing 64 elements (8 × 8) only three sliders are necessary to slide an arbitrary amount in a horizontal direction. Specifically horizontal slider units 302, 304 and 306 for respective slides of 4, 2 and 1 are in cascade. Slider units 302, 304 and 306 are respectively responsive to command signal element arrays 308, 310 and 312. These arrays, which have either all digital one or all digital zero signal elements dependent on the binary code of a desired slide, control whether or not a slide takes in the respective slider units. A binary one command signal array indicates that a shift takes place within the associated slider unit. As an example, if it is desired to slide the input A by six columns, command arrays 308 and 310 would be all digital one while command array 312 would be all digital zero in correspondence with the 110 binary code for the number 6. Thus, the input image A would be slid four columns in slider unit 302 and thereafter slid two columns in slider unit 304 to produce the slide of six. As should be apparent, the order of cascading slider units 302–306 is immaterial in the sense that it does not matter in what order the slides of two and four are performed.

FIG. 21b indicates the construction of the cascaded slider units. The input 314 to the slider unit, from A or from a previous slider unit, is fed to a duplicator 316 to form two duplicate input signal element arrays 318 and 320. Signal element array 320 is inputted to a horizontal slider having a slide of a predetermined amount "N" to form the slide output array 322. Signal element input array 318 and slide array 322 are fed to array selector 324. In response to command array 326, either array 318 or array 322 is gated through to the selector output 328. Selector 324 comprises a duplicator 330 responsive to command array 326 for forming two duplicate command input arrays 332 and 334. Array 332 is fed to inverter 336 and the output 338 of the inverter forms one input to a combiner 340. Input array duplicate 318 is fed to the other input 342 of combiner 340. The output of combiner 340 is applied to AND device 344. The output of AND device 344 forms one input 346 to combiner 348. When the command 326 is digital one, the NOT device output 338 is digital zero and consequently the AND device output array 346 is digital zero. When the command 326 is digital zero, the AND device output 346 is the signal array A.

Command signal duplicate 334 is fed directly to combiner 350 without an inversion and the slide array 322 is fed to the other input 352 of combiner 350. The combiner 350 output is fed to AND device 354 whose output 356 is fed to the other input 358 of combiner 348. Combiner input 358 is all digital zero when the command 326 is digital zero and is equal to the slide array 322 when the command 326 is digital one. Thus at all times combiner 348 has one input of digital zero and one input which is either array 318 (via input 346) or array 322 (via input 358). The output of combiner 348 is fed to OR device 360 output is the selector output 328.

Many interconnection devices may be synthesized utilizing a slider in a feedback path about a two-input gate. In FIGS. 22 and 22a one embodiment 370 of a horizontal sweeper device utilizing slider feedback is illustrated. Sweeper devices are of either the horizontal or vertical type. Horizontal and vertical sweeper devices are respectively responsive to a single predetermined column and row of signals of the input array A. The structure of a vertical sweeper device is identical to horizontal sweeper device 370 provided the device is either physically rotated 90° clockwise or preceded by a 90° clockwise twist device 200 and followed by a 90° counterclockwise twist device. The single predetermined column to which the horizontal sweeper device is responsive is generally the first or leftmost column 372. The horizontal sweeper device output array 0 has every output column the same as column 372. Thus column 372 is swept horizontally to form the output 0.

Embodiment 370 includes an OR gate device 374 which is preceded by a combiner 376 and followed by a duplicator 378 to form an OR gate unit responsive to two spaced apart input array surfaces 378 and 380 (the combiner inputs) and deriving two output arrays 382 and 384 (the duplicator outputs). The leftmost column 372 of input array A is fed to input surface 378 by a signal array bus 386. An opaque mask 388 which blocks all of input array A but column 372 is interposed between bus 386 and input surface 378. Thus the array inputted to surface 378 contains column 372 in the leftmost position and the remainder is digital zero. The other input surface 380 receives feedback from the output 384 via bus 390 and a one column horizontal slider 392 formed by offsetting bus 392 by one column with respect to input surface 380. The output of horizontal sweeper device 370 is duplicator output 382. The operation of horizontal sweeper device 370 is conveniently explained in terms of a sequence of iterative steps. Independent of what signals output 384 initially contains, the feedback input to surface 380 has effectively all digital zeros in the first column 394 (FIG. 22a) by virtue of the action of horizontal slider 392. Since the OR of array A column 372 and all zero column 394 produces a column of elements identical to column 372, the OR unit outputs 382 and 384 have the data of column 372 in the first position after the first iteration. In the second iteration, this column 372 data in the first column position is slid to the second column position by slider 392. Recalling that all elements outside of column 372 of input surface 378 are digital zero due to the action of mask 388, this second column containing column 372 data is passed through to the OR gate outputs 382 and 384 in the second position. Also column 372 appears in the first position of outputs 382 and 384 by the same mechanism as the first iteration. Thus after the second iteration the first two output columns are identical to column 372. That the iterations continue until all the output columns of array 382 contain the data of column 372 should be apparent.

In the horizontal sweeper embodiment 400 of FIG. 23 a single array input buffer amplifier 402 such as an image intensifier is used instead of the OR device 374, combiner 376, and mask 388 of embodiment 370. Since, due to action of the horizontal slider 392 of FIGS. 22 and 22a the first output column 380 is all digital zero and the last column 404 is lost, the operative portion of input 380 is the subarray 406 (FIG. 23a) which has a missing first column. Also, due to the action of mask 388 the operative portion of input 378 is only the first column 372. By splitting off the first column of input bus 386 into a one column bus 408 (an inherent masking) and splitting off the subarray 406 from feedback bus 390 via subarray bus 410, one column bus 408 and subarray bus 410 can be arranged side-by-side to form the composite single array input 412 to amplifier 402. In composite array 412 column 372 is the first column and subarray 406 forms the remainder. The operation of embodiment 400 is quite similar to embodiment 370. In the first iteration, column 372 is coupled to the first column position of output 384 by amplifier 402. In each succeeding iteration the output array 384 is slid one column to the right and column 372 is placed in the first column position.

Horizontal and vertical slider feedback may be used to synthesize "contractors" and "spillers". Two types of contractors are contemplated. In the first type of contractor the digital state of a predetermined signal element of an output array is digital one if any input signal element is digital one. In the second type of contractor, the entire output array is digital one if any input signal is digital one. Since the entire output array of a "spiller" has the same digital state as a single predetermined input element, the spiller may be mechanized by providing an opaque mask 420 (FIG. 24a), which is transparent only in the predetermined element location 422, between the input array and the second type of contractor. In addition the transparent element location 422 of the mask may be selectable by utilizing a mask array input for selectively gating the input A. Other techniques for mechanizing a spiller will be discussed infra. Both the first and second types of contractors are illustrated in the generic embodiment 424 of FIG. 24. When the horizontal and vertical sliders 426 and 428 are linear sliders, the first type of contractor is produced; when sliders 426 and 428 are cyclical sliders the second type of contractor is produced.

Embodiment 424 (FIG. 24) comprises a unit 430 having three inputs 432, 434 and 436 and three duplicate outputs 438, 440 and 442. Output 442 is fed back to input 536 via horizontal one column slider 426 and output 440 is fed back to input 434 via one row vertical slider 428. Input array A is coupled to the remaining unit 430 input 432 while output array O is taken from the output 438. The symbols $F_H$ and $F_V$ respectively represent the arrays coupled to inputs 436 and 434 from the horizontal and vertical sliders. Unit 430 is such that the three inputs thereto A, $F_H$ and $F_V$ are ORed together (A or $F_H$ or $F_V$) to form the duplicate outputs 438, 442 and 456. Inputs 432 and 434 are the input array surfaces of a combiner 44 having an output feeding an OR device 446. The output of OR device 446 forms one input 448 of a second combiner 450. Input 436 is the other input of combiner 450. The output of combiner 450 feeds a second OR device 452. A duplicator 454 fed by the second OR device 452 has two outputs 456 and 442. Output 442 feeds horizontal slider 426 and output 456 feeds a second duplicator 458. Duplicator 458 outputs are arrays 438 and 440.

FIG. 24b is a chart wherein there are illustrated the iterations of embodiment 424 when the horizontal and vertical sliders 426 and 428 are linear sliders. The input array A is illustrated as composed of a square array 460 of four elements a, b, c and d. Elements a and b form the first row while elements c and d form the second row. In the zeroeth iteration, not shown, the input array is gated through to the various outputs and the slider outputs for the first iteration 461 and 462 ($F_V$ and $F_H$) are formed. As a consequence of the vertical slide, $F_V$ for the first iteration has digital zero states in the first row and has the input first row elements a, b in the second row. Also as a consequence of the horizontal slide, $F_H$ for the first iteration has a first column of digital zero states and a second column identical with the first input column a, c. In the first iteration the input A and the aforementioned $F_H$ and $F_V$ are ORed together in unit 430 to form the three duplicate outputs 463 (FIG. 24b). The first iteration outputs 463 contain in each row and column position the result of ORing the input elements in that position with the adjacent input elements to the left and above. Thus the output element 464 in the first row, second column has a digital state which is a result of ORing the element b which is in that position in the input A with the element a to the left (no element is above). Similarly the output element 466 in the second row and second column is the result of ORing element d with the input element c to the left and the input element b above.

For the second iteration the output O is slid horizontally and vertically to form the new $F_H$ and $F_V$ arrays 466 and 468 respectively. $F_V$ array 468 contains digital zeros in the first row and output 463 first row elements in the second row. Similarly $F_H$ array 466 contains a first column of digital zeros and a second column equal to the first column of output array 463. The new $F_V$ and $F_H$ arrays are ORed with input A to form the second iteration output array 469. Since the new $F_V$ and $F_H$ arrays 468 and 466 are identical to the previous $F_V$ and $F_H$ arrays (461 and 462) except for the respective second row, second column elements 472 and 474 only that element position changes from output 463 to output 469. Since the element 472 was derived as the OR of elements a and b and the element 474 was derived as the OR of elements a and c, the result of ORing elements 474 and 474 and the corresponding input element d to form second row and second column output element 476 is logical one if any of the input elements a, b, c or d is logical one. That the output 468 is the same on subsequent iterations is apparent from the fact that as a consequence of the sliding, arrays $F_H$ and $F_V$ are derived from the output elements other than element 476. Thus in the embodiment 424 with linear sliders, the output signal element 476 in the last row and last column is digital one if any input element is digital one.

FIG. 24c indicates the iterations with cyclical sliders in the generic embodiment 424. For the illustrative simple example of a four element square array, the $F_H$ and $F_V$ arrays for the first iteration 482 and 484 are merely formed by what is respectively equivalent to column and row inversions of the input A. Output O for the first iteration 486, which is the result of ORing A and the first iteration $F_V$ and $F_H$, effectively contains elements in each row and column position which are the result of ORing each input element of A in that position with the horizontal and vertical adjacent elements. As a result of the effective row and column nversions due to the four element array cyclic sliders 426 and 428, corresponding elements of the second iteration $F_V$ and $F_H$ arrays 488 and 490 result from ORing a different three of the four output elements. The second iteration output 492 formed by ORing corresponding elements of arrays A, $F_V$ and $F_H$ has all its elements dependent or ORing all four input elements. Thus when the horizontal and vertical sliders 426 and 428 are cyclical sliders a second type of contractor is produced wherein the output array is all digital one only if at least one input element is digital one and is digital zero if all elements of the input array A are digital zero.

While a contractor of the second type may be mechanized by illuminating a saturable image intensifier with a defocussed input array such a mechanization is unduly noise sensitive as compared with the embodiment of FIG. 24. Such an intensifier must have sufficient gain so that a uniform saturated output is produced in response to the energy of a single digital one element spread uniformly over the intensifier input surface by defocussing. Clearly the larger the order of the arrays, the easier the intensifier driven into saturation from the combination of the noise contributions from the input elements. That technique however is somewhat useful to produce a "spiller" where the input array is masked either by mask 420 of FIG. 24a or by mask gating so that only a single element input energy is presented to the intensifier.

In a situation where the flexibility to select which predetermined input element is to be "spilled" into the output array is not required, the predetermined input element digital energy can be directed to a single photoconductor to turn on or off an array source.

The various devices discussed thus far provide building blocks for an entire two-dimensional digital computer system. Such a system would operate on numerical data represented by arrays of binary digital signal elements where a separate digital signal element array or "bit plane" is provided to represent each order of binary significance. Thus for example if the array of numerical data contained numbers ranging from 0–7, three digital bit planes would be required respectively for the 4's, 2's and 1's places. If there were a number 7 in the second row and second column of the data array it would be represented by a digital one signal in the second row and second column of each of the three bit plane arrays.

Utilizing the various gate devices, numerical operations such as addition of the correspondingly located elements of a pair of two-dimensional arrays A and B of numerical data is mechanized in a straightforward manner. FIG. 25a illustrates a two-dimensional adder embodiment 46 somewhat analogous to one-dimensional binary adders. Therein pairs of corresponding digital signal bit planes of the same order $A_n$ and $B_n$ and a carry bit plane $C_n$ (generated from the $n-1$ order bit plane), are compared to determine if there are an odd number of digital one states in corresponding element positions. $A_n$ and $B_n$ are first fed to a two-input exclusive OR gate device 500 having the inputs 502 and 504 and the output 506. The output 506 and $C_n$ are applied to a second exclusive OR device 510 having the inputs 506 and 512 and the output 514 which is the sum array bit plane $D_n$. Each exclusive OR device is composed of AND, OR, NOT, combiner and duplicator devices. Only device 500 will be described since device 510 is identical. $A_n$ is fed to duplicator 514 and the duplicate arrays 516 and 518 formed thereby are respectively fed directly to one input of a combiner 520 and fed to one input of a combiner 522 via an inverting device 524. $B_n$ is applied to a second duplicator 526 and the $B_n$ duplicates 528 and 530 ae fed to the other inputs of combiners 520, and 522. One duplicate 530 of $B_n$ is fed directly to combiner 522 while the other duplicate array 528 is fed to combiner 522 via inverter 532. Thus, the combiners 520 and 522 each receive different ones of the two inputs $A_n$ and $B_n$ in inverted form. The combiners 520 and 522 respectively feed AND devices 534 and 536. The outputs of the AND devices are combined in combiner 537 and applied to an OR device 538 to form the exclusive OR device 500 output array 506.

As is further somewhat analogous to one-dimensional binary adders a carry digital array $C_{n+1}$ for the next bit plane is generated in response to the $A_n$, $B_n$ and $C_n$ arrays. An element of $C_{n+1}$ is digital one if at least two of the corresponding elements of the input arrays are digital one. FIG. 25b illustrates a two-dimensional device embodiment 540 for deriving the carry plane $C_{n+1}$ in response to inputs $A_n$, $B_n$ and $C_n$. Inputs $A_n$, $B_n$ and $C_n$ are respectively applied to duplicators 542, 544 and 546. $A_n$ and $C_n$ duplicates are applied to a combiner 548, $A_n$ and $B_n$ duplicates are applied to a combiner 550 and the other $C_n$ and $B_n$ duplicates are applied to a combiner 552. The three combiners 548, 550 and 552 respectively feed AND devices 554, 556 and 558. The outputs of the AND devices feed a three-input OR gate device 560 having the inputs 562, 564 and 568 and the output 568 which is $C_{n+n}$. Three-input OR gate device 560 comprises a first combiner 570 receiving two of the inputs (562 and 564) and feeding an OR gate device 572. The output of OR gate device 572 and the other input 566 are applied to a second combiner 574. The output of combiner 574 is applied to an OR gate device 576 having the output 568.

In addition to such devices as adders, memory devices are required to produce a two-dimensional computer system. These memory devices may be constructed from the previously discussed gate devices. The memory devices illustrated in FIGS. 26 and 27 utilize regenerative digital feedback.

In FIG. 26, an input digital radiant energy array A to be stored in memory device 580 is applied to one input 582 of a combiner 584 via a combiner 583 and an AND device 585. Combiner 583 is also responsive to a Store Mask input for selectively gating elements of input A through to combiner input 582 via AND device 585. The Store Mask indicates which elements of input A are to be applied to memory device 580. As a consequence of the AND operation device 585, only those input A signal elements in corresponding row and column positions to digital one Store Mask elements are gated through to the memory. The other combiner 584 input 586 is adapted to receive a regenerative feedback signal 587 via bus 589. Combiner 584 feeds OR gate device 588. OR gate device 588 feeds a duplicator 590 having outputs 592 and 594. Output 592 is the memory device 580 output while output 594 derives the feedback signal 587. Feedback signal 587 is carried from output 594 to the input 596 of a combiner 598. Combiner 598, which feeds an AND device 600, is also responsive to an Erase Mask array having digital zero states in element positions where data is to be erased from memory device 580. AND device 600, which feeds combiner 584 input 586, provides a means for gating through the regenerative feedback signal 587 only in element through the regenerative feedback signal 587 only in element positions where data is not to be erased in response to the Erase Mask array. With the Erase Mask array having all digital one states the memory device output 592 is set to a digital one state in any array location where input A is digital one. When any portion of input A is removed from input 582 by suddenly providing Store Mask elements with digital zero states the output 592 remains the same as the original input A because the feedback signal array 587 maintains a duplicate of input A at combiner input 586. The memory may be selectively erased by providing a digital zero state to those element positions of the Erase Mask signal array where erasure is desired. The output signals of array 592 in those positions would then be equal to the states of those presently gated through input A elements.

Thus any particlar signal elements of the memory 580 may be selectively set and selectively erased without disturbing other stored signal elements. Digital zero elements of the Erase Mark input signal indicate those positions in memory to be erased while digital one elements of the Store Mask indicate which elements of memory are to be set to the present states of correspondingly positioned elements in input A. In order to store in a particular memory element location it is necessary to first command an erasure in that location.

Figure 27:
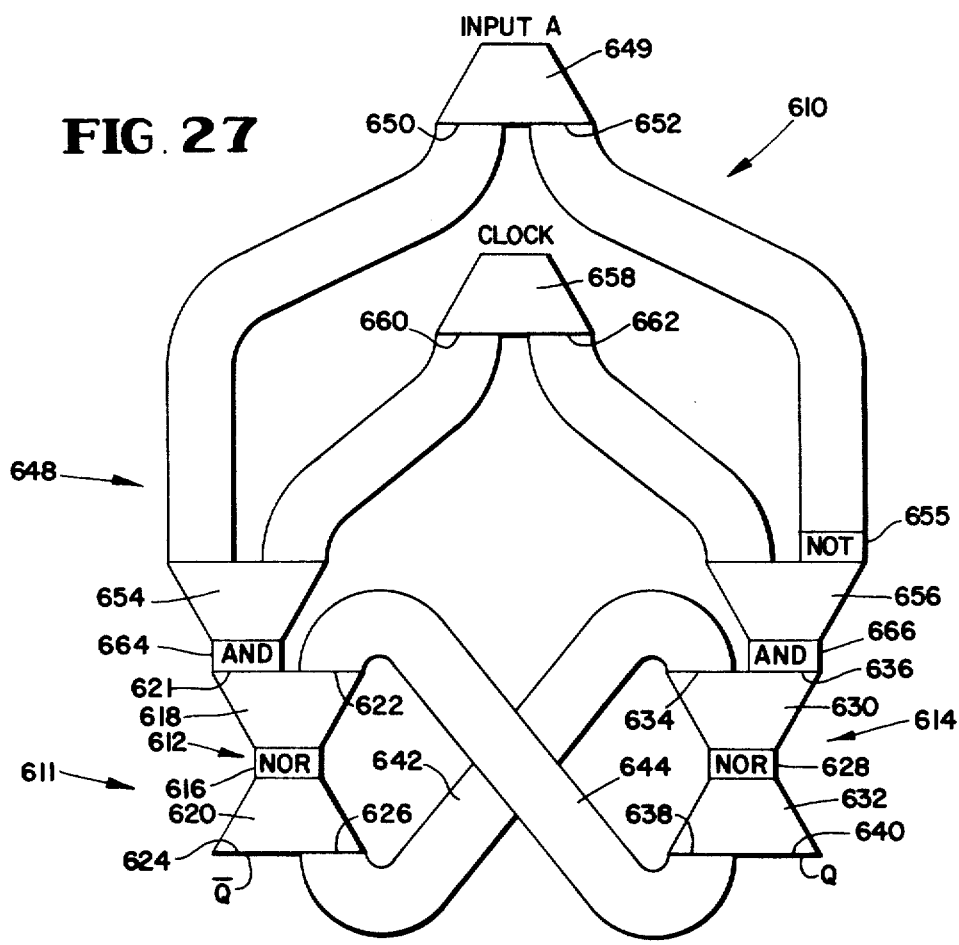
FIG. 27 is a schematic view of an alternate embodiment of a memory device responsive to a clock input.

The memory device of FIG. 27 is a two-dimensional gated R/S flip-flop device 610. The heart of the device 610 is an R/S flip-flop 611 composed of a pair of cross-coupled NOR gate units 612 and 614 for establishing the necessary regenerative digital feedback. NOR gate unit 612 comprises a two-dimensional NOR gate device 616 between a combiner 618 and a duplicator 620. A NOR gate device may be made by placing an inverter after an OR gate device. The combiner 618 inputs are 621 and 622 and the duplicator 620 outputs are 624 and 626. NOR gate unit 614 comprises another NOR gate device 628 between a combiner 630 and a duplicator 632. The inputs to duplicator 630 and 634 and 636 and the outputs from duplicator 632 are 638 and 640. The cross-coupling is accomplished by connecting the output 626 of NOR gate unit 612 to the input 634 of NOR gate unit 614 via fiber optic image bus 642 and by connecting the output 638 of NOR gate unit 614 to the input 622 of NOR gate unit 612 via bus 644. An output memory array Q is taken from output 640 and the array $\bar{Q}$, which is the inverse of Q, is available from output 624. The inputs to the R/S flip-flop 611 and 621 and 636. Due to the configuration of the input circuitry 648 to R/S flip-flop 611, corresponding elements of the input arrays 621 and 636 cannot both have digital one states which is an indeterminate condition. If a pair of corresponding elements of the input arrays are different, then that input element which has a digital one state causes a digital zero output in that element position from the first NOR unit to which it is applied. Since a digital zero state is present in the other R/S flip-flop input, that input and the output coupled from the first NOR unit (both of which are digital zero in that element position) produce a digital one in that position of the output array of the second NOR unit. That digital one state is cross-coupled to reinforce the effect of the digital one element state applied to the first NOR gate unit via the R/S flip-flop 611 input. Thus a set or reset function is produced. If corresponding elements of input arrays 620 and 636 are digital zero there is no change of the state of R/S flip-flop 611 in those signal element positions.

Input circuitry 648 comprises a duplicator 649 to which input A is applied. The duplicator outputs 650 and 652 are respectively directly coupled to a combiner 654 and coupled via an inverter 655 to a combiner 656. A clock input array is applied to a duplicator 658 to form the two dupliate clock signal arrays 660 and 662. Clock duplicate arrays 660 and 662 are directly coupled to combiners 654 and 656. Combiner 654 feeds AND device 664 while combiner 656 feeds AND device 666. The outputs of AND devices 664 and 666 are respectively the R/S flip-flop 611 input arrays 620 and 636. When a given clock signal element is digital zero the setting of the R/S flip-flop is inhibited because the corresponding elements of arrays 620 and 636 are forced to digital zero in the AND devices 664 and 666.

A digital one clock signal element enables the setting of R/S flip-flop 611 in that element position. The flip-flop is set in a manner when if the enabled element of input A is digital one the outputs 624 and 626 of NOR device 612 are forced to digital zero in that position by the digital one input 621 via enabled gate 664 and the digital zero input via inverter 655 and enabled AND gate 666. Also the inputs 638 and 640 of NOR unit 614 have digital one in that element position. The outputs are reversed if the enabled input element is digital zero. Thus the output array Q from NOR unit 614 contains the enabled input data.

The clock input array may be masked to provide only the selective storage enablement in specific array positions stored by memory device 610.

Figure 28:
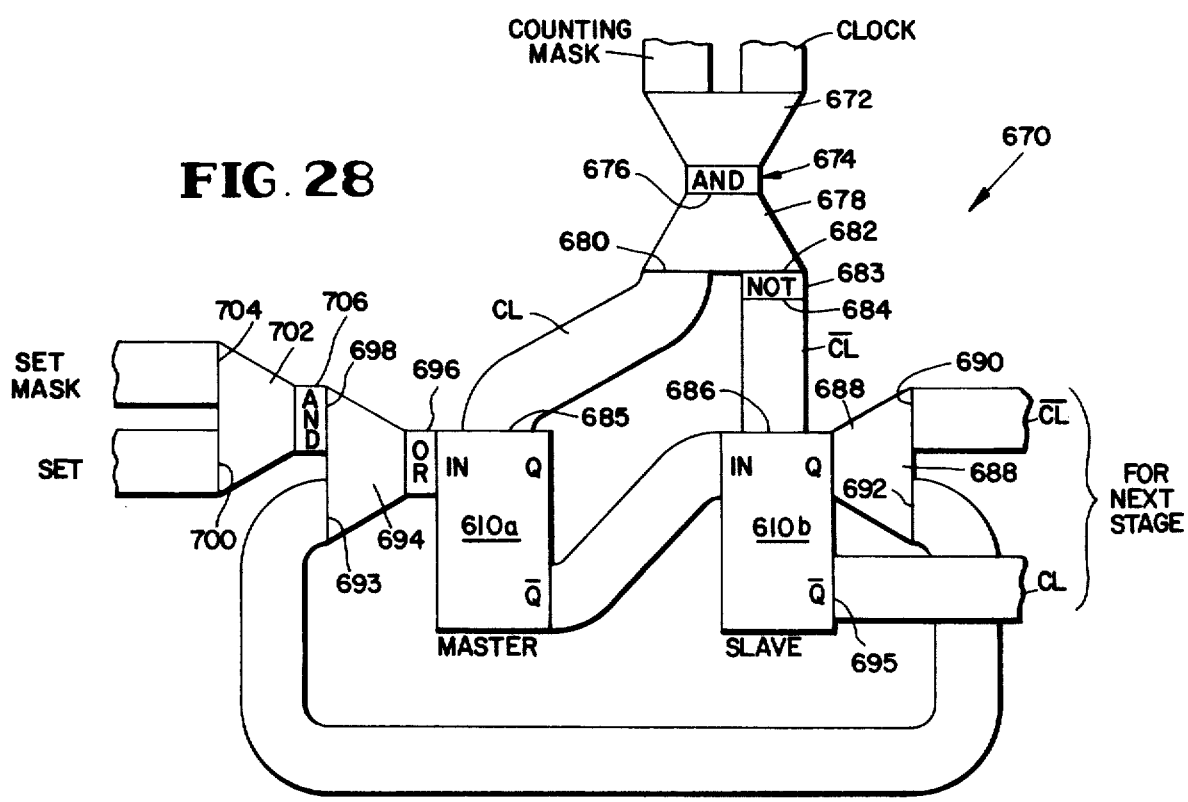
FIG. 28 is a schematic view of one stage of a counting chain employing two clocked memory devices of FIG. 27.

The memory device 610 conveniently forms a building block of a two-dimensional array counter system. The first stage 670 of the counter system is schematically illustrated in FIG. 28 in which master and slave memory devices 610a and 610b are used. A counting mask input array, which has digital one signal states in the element locations were counting is to take place, is combined with a clock signal array in combiner 672. The clock signal periodically varies between all digital one states and all digital zero states in accordance with a clock frequency. Such a clock signal may be generated from a one-dimensional clock source followed by a "spiller" (not shown). Combiner 674 feeds AND gate device 674 to produce at the AND gate device output 676 a masked clocked signal having the elements in which counting is to take plce periodically varying in accordance with the clock frequency. Output 676 is applied to duplicator 678 to produce two duplicate masked clock arrays 680 and 682. Masked clock array 682 is applied to an inverter 683 to form an inverted masked clock array 684. The master memory device 610a receives the masked clock array 680 at its clock input 685 and the slave memory device 610b receives the inverted masked clock array 684 at its clock input 686. The data input of slave memory device 610b is fed by the $\bar{Q}$ output of master memory device 610a. The Q output array of slave memory device 610b is applied to a duplicator 688 to form two duplicate Q output arrays 690 and 692. Array 690 forms the inverted masked clock input to the next stage while Q output duplicate 692 is fed back to the master memory device 610a data input via one input 693 of a combiner 694 and an OR gate device 696. The $\bar{Q}$ output 695 of slave device 610b forms the masked clock input for the next stage. The other input 698 of combiner 694 provides a means for setting certain elements of the Q output of memory device 670 to allow initializing or reinitializing the counter system. A Set array input, which is normally all digital zero during counting, is applied to one input 700 of a combiner 702. The other combiner 700 input 704 is fed by a Set Mask input, having digital one states in the element positions where it is desired to set the Q output of memory device 610a to digital one. The combiner 702 feeds AND device 706 which in turn feeds combiner 694 input 698. When the Set input is all digital one the Q output of master device 610a is set to digital one in those positions indicated by the Set Mask and enabled by the digital one element states of masked clock signal 680.

In the operation of the counting stage 670, during one-half clock cycle master device 610a is set while in the other half clock cycle memory device 610b is set. In the second half clock cycle, slave 610b is set to the inverse of what master 610a was set to in the first half clock cycle and on the next first half clock cycle master 610a is set to the same states as slave 610b via the feedback path from output 692. Thus it takes a full clock cycle for the instantaneous output Q of master 610a to be fed back for setting the master in an inverted sense. Therefore the masked clock inputs for the next stage 690 and 695 change at one-half the frequency of the masked clocks inputs 680 and 684 of stage 670. Subsequent counter stages 670 are idential to stage 670 except that the master and slave masked clock inputs 685 and 686 are fed from the previous stage masked clock outputs 690 and 695.

Another ingredient of a two-dimensional computer system is an analog to digital converter for converting analog optical images to a series of arrays of digital signals with an array for each binary bit of significance. An illustrative schematic embodiment 710 for converting an eight grey level two-dimensional input image to three two-dimensional bit signal arrays is schematically shown in FIG. 29.

Embodiment 710 consists of three cascaded stages 712, 714 and 716. Stages 712 and 714 are similar while the last stage 716 is a reduced version of stages 712 and 714 because no parts are required for feeding a subsequent stage.

The input analog image is coupled to a duplicator 718 of the first stage to form two duplicate analog images 720a and 722. Duplicate analog image 722 is applied to a thresholding device 724 which will be more completely desribed in conjunction with FIG. 30. Basically, considering the eight level input image to have signal elements ranging in amplitude from 0 to 7, the threshold device 724a derives an output array 726 having a "1" level output in corresponding positions when the input signals of array 722 are four or greater and to give a "0" level output in positions where the input signals are less than four. Output 726 is applied to a duplicator 728 having two duplicate output arrays 730 and 732. Output array 732 is the output array of A/D converter 710 for the most significant bit. Array 730 is applied to an inverter 734. The output of inverter 734 is applied to an amplifier or image intensifier 736a having a gain of four. The amplififier 736a output 738a thus has an output signal of level four in positions where the input image was less than four. In correspondence with image signals of level four or greater, amplifier output 738a is zero. Input image duplicate 720a and amplifier output 738a are fed to the respective inputs 740 and 742 of combiner/duplicator device 744 used as an analog adder. Device 744 is essentially a backwards duplicator since it feeds a single array bus 746a from the combined array output surface 748. The configuration is just the reverse of the duplicator 170 of FIG. 11 where corresponding combined array conduit ends of size 176 each feed a conduit element of size 176. Therefore the sum image carried by bus 746a has the amplitudes corresponding elements of array 720a and 738a added together.

Since the elements of array 738a are of amplitude four where the elements of array 720a are less than four and are of amplitude 0 where the element of array 720a are greater than four, the sum image of bus 746a has amplitudes ranging only between four and seven. In particular, those input image elements having amplitudes of 0, 1, 2 and 3 are respectively converted to amplitudes of 4, 5, 6 and 7 and those input image elements having amplitudes of 4–7 are unchanged. Bus 746a is the output of stage 712.

Stage 714, for which the intermediate significance bit array is derived, is identical to stage 712 except that thresholding device 724b thresholds at amplitude six and the amplifying device 736b introduces a gain of two. Stage 714 is fed by bus 746 having signal amplitudes ranging from four to seven. The output 738b amplifier 736b has an amplitude of two at those signal elements where the stage input 746a has amplitudes of four or five and has an amplitude of zero at those signal elements where the input 746a has amplitudes equal to six or seven. By the image addition in adder 744 of duplicate stage input array 720b and amplifier output 738b, the sum image 746b, which is the output of stage 714, has only amplitudes of six or seven. In particular it has an amplitude of six in element positions where the original analog input image to stage 712 has an even number amplitude and has an amplitude of seven in element positions where the original analog input image has an odd number amplitude.

Stage 714 output 746b is applied to the third stage 716 which comprises merely a thresholding device 724c for amplitude of seven. The output of thresholding device 724c is the least significant bit array.

The thresholding devices are amplifiers with very non-linear steep response curves as a function of amplitude. Few available devices have such a characteristic since such devices as image intensifiers are intended to be linear. One suitable technique of obtaining a steep non-linear response is to emphasize any small non-linearities with regenerative feedback. Such a technique is illustrated in FIG. 30 which illustrates one stage 754 of an A/D converter. The thresholding device 724 is substantially similar to the memory device 580 of FIG. 26 and the same reference numerals are used for those parts which are common to FIG. 26.

The threholding device comprises on OR gate 588 (or an amplifier) between a combiner 588 (which is a summing device when feeding to an amplifier) and duplicator 590. One input 582 of combiner 584 recieves the array to be thresholded while the other combiner 584 input 596 receives regenerative feefback 587 from duplicator output 594 which is selectively gated through to input 596 via a combiner 598 and AND device 600 in response to an Erases Input Array to combiner 598. When the Erase Array has all digital one states the regenerative feedback signal 587 is received at input 596. Assuming that the device 588 has a gain which is dependent on the signal amplitude of the elements of array 582, the d.c. loop gain to the regenerative feedback signal also depends on the amplitude of array 582 signal elements. In particular at some signal amplitude M, the loop gain will equal one. As is well known, when the d.c. loop gain is equal to or exceeds one the loop will drive itself into saturation, strongly amplifying those signal elements of the input array 582 which are of amplitude M or greater. On the other hand, signal elements of the input array which are less than amplitude M will be at most only slightly amplified. Thus device 724 thresholds at a fixed value M. since the device is essentially a memory device it must be erased in response to the Erase input (i.e., the feedback path of signal 587 must be cut) prior to applying a new input array to stage 754.

The output 592 of thresholding device 724 is applied to duplicator 728, one duplicator output 732 is the Bit Array derived from stage 754 and the other duplicator output 730 feeds inverter 734.

Since the thresholding devices inherently thresholds at the same value M for each stage the inputs 582 must be relatively scaled so that a second stage input signal amplitude of six, for example, is attenuated to the relatively low value M by being passed through a filter 756 prior to input 582. Similarly it is convenient to eliminate the amplifiers 736 and to substitute therefor a different attenuating filter 758 for each stage. The attenuators for the different stages are relatively scaled in attenuation inversely to the gains of the amplifiers they replace.

Figure 31:
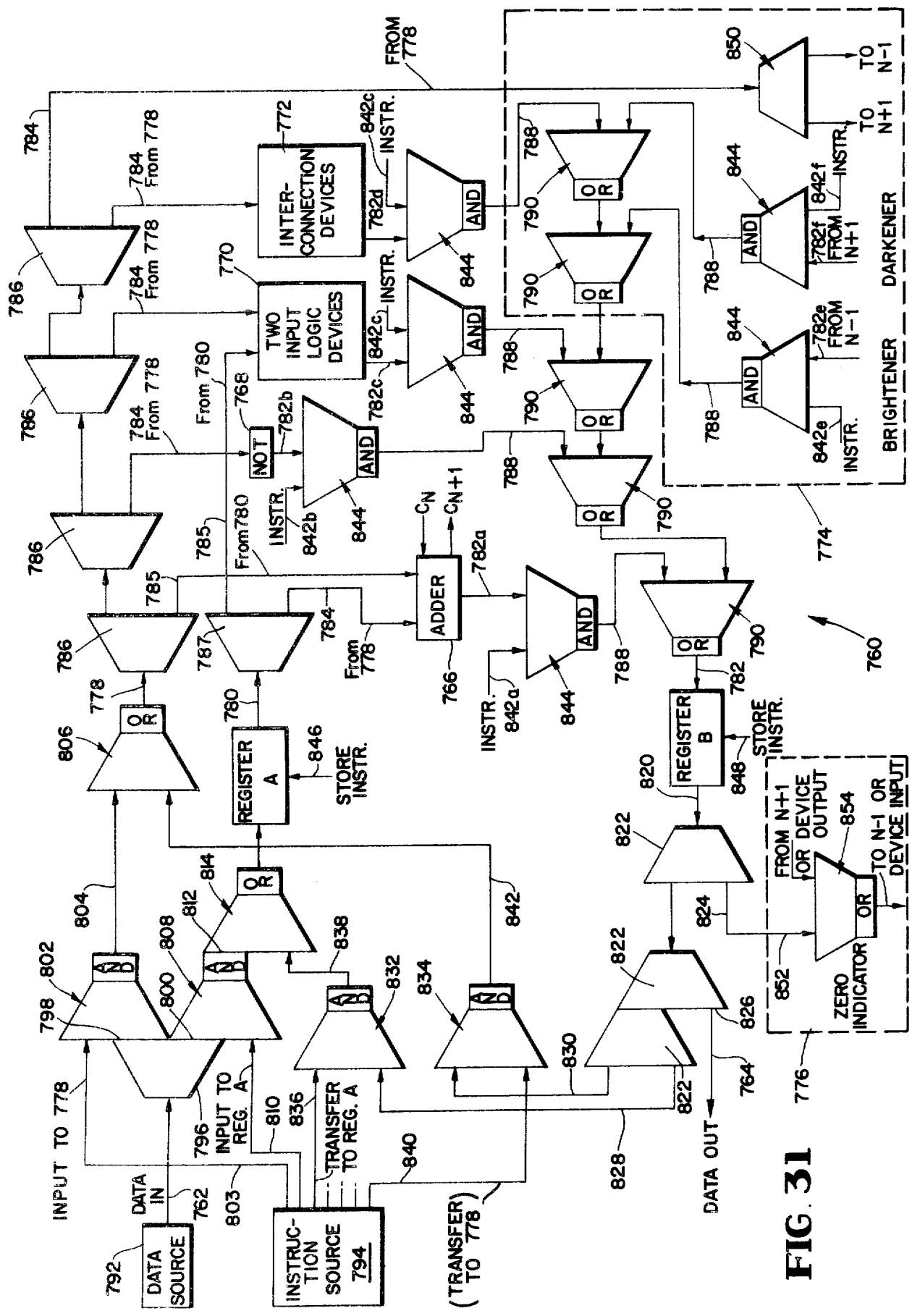
FIG. 31 is a schematic diagram of an arithmetic unit for one bit plane of data for a computer system responsive to data and instruction sources.

FIG. 31 schematically illustrates a two-dimensional digital computer arithmetic unit 760 for a digital signal array representation of the Nth bit of numerical array data. A different arithmetic unit 760 is provided for each bit. Thus if the numerical data has eight bits of significance there are eight of each of the various parts. Arithmetic unit 760 includes array data input and output lines 762 and 764 and two array memory temporary storage registers A and B in which either inputted or computed data may be stored. Various arithmetic and logical computational devices are provided in arithmetic unit 760. The computational devices are an adder 766; and inverter or NOT device 768; two-input logic devices 770 such as AND, OR, NAND, NOR, and Exclusive OR devices; interconnection devices 772 such as sliders, sweepers, row and column inverters, transposers, twisters, contractors and spillers; brightener-darkener circuitry 774; and zero indicating circuitry 776.

Two input array busses 778 and 780 are utilized for the various arithmetic and logical devices 776–774. Input bus 778 is fed either by the input array data 762 or by the register B. Input bus 780 is fed by the register A. The computed array data outputs 782 a–f from the various arithmetic and logical devices feed an output bus 782 which in turn feeds the register B. Means are provided for transferring the computed data stored in register B to register A and therefore to input bus 780.

The adder 766, and the two-input logic devices 776 receive inputs from both busses 778 and 780, while one-input devices such as the inverter 768, the interconnection devices 772 and the brightener-darkness 774 only receive inputs from bus 778.

The various inputs to the arithmetic and logic devices from busses 778 and 780 are split off from the busses via the respective available outputs 784 and 785 of cascaded duplicators 786 and 787 which are respectively fed by busses 778 and 780.

The various outputs 782 a–f from the device are delivered to output bus 782 via the available inputs 788 of cascaded combiner/OR gate device combinations 790.

The input data array on line 762 is derived from a data source 792 which is either a memory unit, such as a digital radiant energy array data link or an analog image followed by an analog to digital converter. The memory unit will be more fully discussed in conjunction with FIGS. 32a and 32b as will be a source 794 of instructions arrays for the arithmetic unit 760.

The data elements from source 792 are selectively placed on either or both of the input busses 778 and 780 in response to commands from instruction source 794. Data input bus 762 is coupled to a duplicator 796 for forming two duplicate data inputs 798 and 800. Data duplicate 798 is applied to one input of a combiner/AND device combination 802. An instruction array bus 803 from instruction source 794 is fed to the other input of combiner/AND device combination 802. The output 804 of combination 802 feeds the input bus 778 via a combiner/OR device combination 806. Therefore digital one elements carried by the instruction bus 803 cause the corresponding elements from data source 792 to be applied to input bus 778.

The other duplicator 796 output 800 is applied to one input of another combiner/AND device combination 808. The other input of combination 808 is fed by another instruction array 810 from instruction source 794. The output 812 of combination 808 is coupled to the register A via combiner/OR device combination 814. Thus those elements of instruction array 810 which are digital one indicate the positions of digital signal elements within the data array which are to be supplied to register A for later application to input bus 780.

The various elements of the arrays stored in register B array may be selectively transferred to either input bus 778 or register A. The output 820 of register B is applied to three cascaded duplicators 822 to form four duplicate outputs 824, 826, 828 and 830 of register B output 820.

One duplicate output 824 feeds the zero indicator circuitry 776. Another duplicate output 826 feeds the data output line 764. Data output line 764 may be applied to a memory, an output digital array data link or to an analog image data link via a suitable digital to analog converter. The other duplicate outputs 828 and 830 respectively feed one of the inputs of combiner/AND device combinations 832 and 834. The other input of a combination 832 is fed by an instruction array 836 from instruction source 794 and the output 838 of combination 832 is coupled to the register A input via OR combination 814. Thus the digital one elements of instruction 836 indicate which array elements of data contained in register B are to be transferred to register A.

Similarly, the other input of AND combination 834 is fed by an instruction array 840 from instruction source 794. The output 842 of AND combination 834 feeds the input bus 778 via OR combination 806. Thus the digital one elements of instruction 840 indicate which array elements stored in register B are to be applied to input bus 778.

The outputs 782 a–f of the various arithmetic and logic devices in arithmetic unit 760 are respectively gated in response to instruction arrays 842 a–f from instruction source 794 so that in effect different operaons may be formed with respect to different array element locations. The digital one elements of each instruction array indicate which output elements from which devices are to be applied to the output bus 782 inputs 788. Each of the corresponding instruction arrays 842 *a–f* and the device outputs 782 *a–f* is applied to the two inputs of combiner/AND device combinations 844 which in turn feed the output bus via cascaded OR device inputs 788.

The registers A and B which are composed of memory devices such as illustrated in FIGS. 26 and 27 are selectively loaded respectively in response to instruction arrays 846 and 848 from instruction source 794. Instruction arrays 846 and 848 operate as either a masked erase input for memory device of FIG. 26 or as a masked clock input for a memory device of FIG. 27.

The brightener-darkener circuitry 779 is analogous to the shift operation of one dimensional digital computers wherein digital states are selectively transferred from one digital array representative of one order of binary significance to another digital array representative of another order of binary significance. An "image brightening" is an increase while an "image darkening" is a decrease in binary significance. The digital signal arrays carried by the input busses 784 for the next lower and next higher order significance (arrays 842 *e* and *f*) are respectively applied to AND devices 844 and gated through to bus 782 by instructions 842 e and f in those element positions where respectively brightening or darkening is desired. Similarly the 778 bus array is applied to a duplicator 850 to supply the inputting 778 array to the brightener-darkener circuits 774 for the next higher and the next lower order.

The zero indicator circuitry 776 derives an array indicative of where all the elements in the same position in the arrays contained by register B are digital zero. Thus the arrays for each bit are applied to the available inputs 852 of the zero indicator circuitry. The arrays are ORed together in cascaded combiner/OR devices combinations 854 to determine if at least one element of those in corresponding positions is digital one.

The instruction source 794 and a memory data source 792a will be described in conjunction with FIGS. 32a and 32b. The various digital arrays used will be illustrated as simple four-element (2 × 2) arrays for ease of understanding. It should be understood that the principles of the invention are equally applicable to digital signal element arrays containing one million signal elements (1000 × 1000).

Figure 32B:
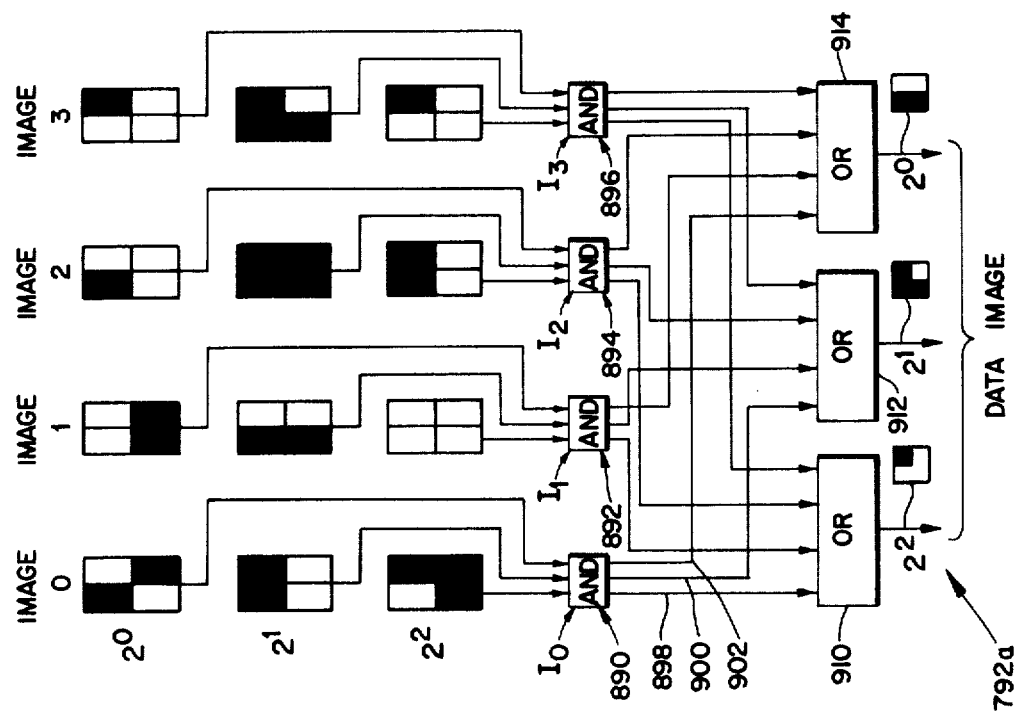
Figure 32A:
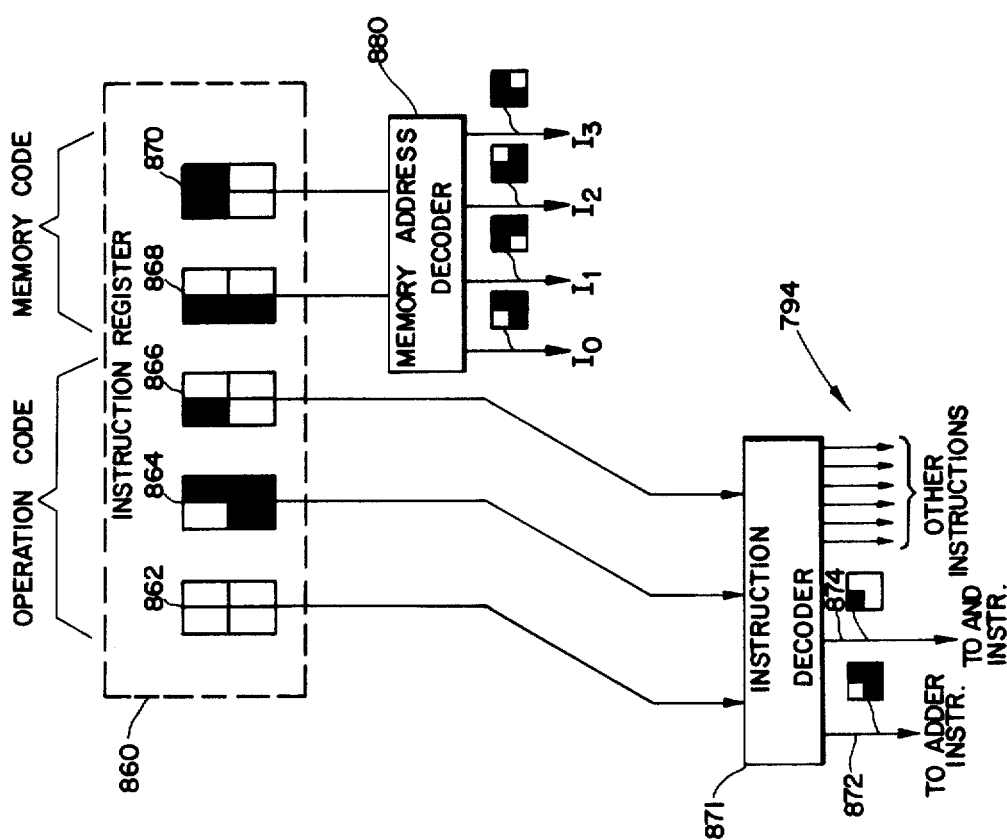
FIG. 32a is a schematic diagram of an instruction source including a memory address decoder.

The heart of the instruction and data sources is an instruction register 860 which is schematically illustrated in FIG. 32a. Instruction register 860 is composed of memory devices for temporarily holding or storing a plurality of digital arrays. For simplicity five memory devices 862, 864, 866, 868 and 870 are represented. Each of the memory devices stores a four-element digital signal array. Illustrative digital states of the array elements are colored in the memory device representations when black corresponds to a digital zero state and white to a digital one state. The first three memory devices 862, 864 and 866 are associated with an operations code. Since the three arrays correspond to three binary levels of significance there is the capability of providing eight different array instructions to the arithmetic unit 760 of FIG. 31. The three memory devices 862–866 feed an instruction decoder 871. Instruction decoder 871 has eight output arrays. One of the output arrays 872 feeds the adder instruction 842a while another feeds the instruction to one of the two-input logic devices 770 such as an AND device. While more than eight decoder outputs (and consequently more than three bits of significance) are required to feed the many different instruction arrays required in FIG. 31 the illustrative embodiment of FIG. 32a has been limited to a three significant bit operations code for ease of understanding.

Basically, each instruction decoder output array is sensitive to a different one of the eight possible digital codes from the three memory devices 862, 864, 866. For example decoder output 872 is responsive to a 1,1,0 digital code and decoder output 874 is responsive to a 1,0,1 digital code. Since according to the illustrative states of memory devices 862–864, the first row, first column elements of arrays 862, 864 and 866 are respectively the digital states 1,1,0 then the corresponding first row, first column of output array 872 is digital one. Thus the instruction issued to the adder 766 of FIG. 31 indicates that the first row, first column element of output 872 be loaded into register B. Since that code is not present for the other element positions of instruction register arrays 862–864, only that element of the result of the addition is loaded into register B. Effectively then the arithmetic unit added only the first row, first column elements of the register A contents and the input bus 778 contents. Other operations can be done on other array element positions simultaneously. For example, according to the illustrative states of memory devices 862–866, all three other element positions have the digital code 1,0,1 indicating an AND operation which is decoded onto instruction array 874. Thus two or more different operations can be performed simultaneously on different elements or regions of array data.

The other two memory devices 868 and 870 of instruction register 860 are considered to represent a memory code indicative of which images contained in memory should be put together to form the data source 792a, shown in FIG. 32b. Since only two arrays are used in this simple example there is the capability to address only four memory images, images 0, 1, 2 and 3.

Memory elements 868 and 870 feed memory address decoder 800 which has four output arrays $I_0$, $I_1$, $I_2$, and $I_3$. Output $I_0$ has digital one in each element position where the array 868 and 870 have the digital code 0,0. Similarly, the other outputs have a digital one in element positions when the digital code equals the image number. Since according to the illustrative digital states in memory devices 868 and 870, the bottom righthand element has the digital code 1,1 array $I_3$ has a digital one in that position. Furthermore, according to the illustrative digital states, the top lefthand element is to be taken from image 0, the bottom lefthand element from image 1, the top righthand element from image 2 and the bottom right-hand element from image 3.

FIG. 32b indicates a memory organization of image memories 0–3. Each memory holds three arrays for three bits of significance. Each array has four elements. Thus the memory is organized to contain effectively four signal images of four elements each with each element position in each image memory representative of the integers from 0–7. The memory arrays are gated by the associated memory address decoder outputs or masks in AND units 890, 892, 894, 896. The three arrays for image 0 are separately ANDed with $I_0$ in AND unit 890 to form three output arrays 898, 900 and 902 which respectively have the same states as the $2^2$, $2^1$ and $2^0$ image 0 memory arrays only in the top left position indicated by $I_0$ and have digital zero in the other positions. The outputs of the other AND units 892–896 are similarly related to the respective memory decoder outputs or masks $I_1$–$I_3$ and the respective memory images 1–3. The output of each of the AND units 890–896 for each of the three binary order of significance are applied to three OR units 910–914. The OR units 910–914 combine the gated images for each order of significance. Each OR unit is associated with an order of significance and is supplied with a gated memory array for that order of significance from each AND device 890–896. Thus as an example the $2^1$ OR device output has in the bottom right a digital one state which it derived from the bottom right of the $2^1$ bit plane Memory image 3 as required by $I_3$.

Having described illustrative embodiments of the invention, it should be clear that numerous modifications are within its spirit and scope. It should be clear that devices for processing two-dimensional arrays of very few signals have been illustrated for only ease of understanding and that the principles of the invention are equally applicable to extremely large arrays of signal elements. While the description of the embodiments has concentrated primarily on optical signals it should be clear that many of the principles of the invention are equally applicable to electron beam X-ray, electromagnetic radiation and other forms of radiant energy capable of being imaged. Therefore, it is intended that the invention be ascertained with reference to the following claims:

What is claimed is:

1. A radiant energy digital device comprising:
   a two-dimensional input array of ordered digital radiant energy signal conduits;
   a two-dimensional output array of ordered digital radiant energy signal conduits;
   wherein the signal conduits of input and output arrays have positions in correspondence; and
   radiant energy interconnection means connected between said input and output conduit arrays and having a means for directing digital signals in the input conduits to the output conduits, said output conduits being offset in position from the input conduits by a predetermined amount.

2. The device of claim 1 wherein the offset in position causes the digital signals in the input conduits not ordinarily to appear in the output array and predetermined conduits of the output array not to carry digital signals, further including additional radiant energy interconnection means for directing the digital signals from the input conduits into those predetermined output conduits.

3. The device of claim 1 wherein said interconnection means comprises means for directing the signals from each input conduit to a predetermined output conduit in a manner where said predetermined output conduit has a signal with a predetermined digital state dependent on whether any of the states of the input array signal is a predetermined digital state.

4. The device of claim 3 wherein the predetermined digital states are digital one.

5. A radiant energy digital device comprising:
   a two-dimensional input array of ordered digital radiant energy signal conduits;
   a two-dimensional output array of ordered digital radiant energy signal conduits;
   wherein the signal conduits of input and output arrays have positions in correspondence; and
   radiant energy interconnection means connected between said input and output conduit arrays and having a means for directing a signal from at least one input conduit to a plurality of output conduits.

6. The device of claim 5 wherein said means for directing comprises means for connecting the digital signals in a rectangular sub-array of said input array to the conduits of the output array wherein groups of predetermined numbers of output conduits carry only the digital signal from each conduit of said sub-array.

7. The device of claim 6 wherein said sub-array is centrally positioned in said input array.

8. The device of claim 6 wherein said output conduit groups are different sub-arrays of said output array.

9. The device of claim 6 wherein there is a predetermined number of sub-arrays of the input array which is equal to the number of conduits in said groups.

10. The device of claim 9 wherein the output sub-arrays positions are in one-to-one correspondence with input sub-array conduit positions.

11. A radiant energy digital device comprising:
    a two-dimensional input array of ordered digital radiant energy signal conduits;
    a two-dimensional output array of ordered digital radiant energy signal conduits;
    wherein the signal conduits of input and output arrays have positions in correspondence and are rectangular arrays having rows and columns of conduits; and
    radiant energy interconnection means connected between said input and output conduit arrays and having a means for directing the digital signals in each input conduit characterized by a row and column to an output conduit having the same row and a mirror image column location.

12. A radiant energy digital device comprising:
    a two-dimensional input array of ordered digital radiant energy signal conduits;
    a two-dimensional output array of ordered digital radiant energy signal conduits;
    wherein the signal conduits of input and output arrays have positions in correspondence and are rectangular arrays having rows and columns of conduits; and
    radiant energy interconnection means connected between said input and output conduit arrays and having a means for directing the digital signals in each input conduit characterized by a column and row to an output conduit having the same column and a mirror image row location.

13. A radiant energy digital device comprising:
    a two-dimensional input array of ordered digital radiant energy signal conduits;
    a two-dimensional output array of ordered digital radiant energy signal conduits;
    wherein the signal conduits of input and output arrays have positions in correspondence and are rectangular arrays having rows and columns of conduits; and
    radiant energy interconnection means connected between said input and output conduit arrays and having a means for directing the digital signals in each input conduit characterized by a row and column to an output conduit having mirror image column and row locations.

14. A radiant energy digital device comprising:

a two-dimensional input array of ordered digital radiant energy signal conduits;

a two-dimensional output array of ordered digital radiant energy signal conduits;

wherein the signal conduits of input and output arrays have positions in correspondence and are rectangular arrays having rows and columns of conduits; and radiant energy interconnection means connected between said input and output conduit arrays and having a means for directing digital signals in each input conduit characterized by a row and column to an output conduit having a row and column location obtainable by rotating said input array through a predetermined angle.

15. The device of claim 14 wherein said predetermined angle is a multiple of 90°.

16. A radiant energy digital device comprising:

a two-dimensional input array of ordered digital radiant energy signal conduits;

a two-dimensional output array of ordered digital radiant energy signal conduits;

wherein the signal conduits of input and output arrays have positions in correspondence and are rectangular arrays having rows and columns of conduits; and radiant energy interconnection means connected between said input and output conduit arrays and having a means for directing digital signals in each input conduit characterized by a row and column to an output conduit having a row and column location obtainable by interchanging rows and columns of said input array.

17. The device of claim 16 wherein said interconnection means comprises an intermediate conduit array and first means for directing digital signals from conduits of said input array characterized by row and column positions to conduits of said intermediate array in mirror image positions of said input array conduits and second means for directing digital signals from said intermediate to those conduits of the output array having positions obtainable by rotating said intermediate array of 90°.

18. The device of claim 17 wherein said mirror image positions are mirror image row positions and the same column positions as said input array.

19. The device of claim 17 wherein said mirror image positions are mirror image column positions and the same row positions as said input array.

20. A radiant energy digital device comprising:

a two-dimensional input array of ordered digital radiant energy signal conduits;

a two-dimensional output array of ordered digital radiant energy signal conduits;

wherein the signal conduits of input and output arrays have positions in correspondence; and radiant energy interconnection means connected between said input and output conduit arrays and having a means for directing the digital signal from one predetermined input conduit to each output conduit in said output array.

21. A radiant energy digital device comprising:

a two-dimensional input array of ordered digital radiant energy signal conduits;

a two-dimensional output array of ordered digital radiant energy signal conduits;

wherein the signal conduits of input and output arrays have positions in correspondence and said input array of conduits includes a rectangular sub-array of conduits; and radiant energy interconnection means connected between said input and output conduit arrays and having a means for directing only the digital signals in said sub-array of input conduits to the output array.

22. A radiant energy digital device comprising:

a two-dimensional input array of ordered digital radiant energy signal conduits;

a two-dimensional output array of ordered digital radiant energy signal conduits;

wherein the signal conduits of input and output arrays have positions in correspondence and are rectangular arrays having rows and columns of conduits; and radiant energy interconnection means connected between said input and output conduit arrays and having a means for directing the signals from only one predetermined column of said input array to said output array.

23. The device of claim 22 wherein said directing means is such that digital radiant energy from each conduit characterized by row positions in said predetermined column is directed to all the conduits of the output array having the same row position.

24. A radiant energy digital device comprising:

a two-dimensional input array of ordered digital radiant energy signal conduits;

a two-dimensional output array of ordered digital radiant energy signal conduits;

wherein the signal conduits of input and output arrays have positions in correspondence and and are rectangular arrays having rows and columns of conduits; and radiant energy interconnection means connected between said input and output conduit arrays and having a means for directing the signals from only one predetermined row of said input array to said output array.

25. The device of claim 24 wherein said directing means is such that digital radiant energy from each conduit characterized by column positions in said predetermined row is directed to all the conduits of the output array having the same column position.

26. A digital radiant energy signal array slider system for sliding an input radiant energy signal array an arbitrary amount in response to a slide command signal comprising: an input rectangular array of digital radiant energy elements having row and column positions;

a plurality of slider means associated with the slide command signal and having binary coded slide values of value $2^j$ where each slider means has a different slide value;

at lease one gating means responsive to the slide command signal associated with each of said slider means, the gating means selectively bypassing the associated slider means when the slider and gating means combinations for each different slide value is connected in cascade, the first of said cascaded combinations connected to said input array and the last of said cascade combinations deriving an output digital radiant energy signal array having the same number of rows and columns as said input array.

27. The system of claim 26 in combination with a slide command signal source comprising a plurality of digital radiant energy signal arrays, each connected to one of said gating means.

28. The system of claim 26 wherein said plurality of slider means are of binary coded different slides for sliding in both rows and columns.

29. A digital radiant energy logic device comprising:
    imaging means for inputting first and second planar two-dimensional input arrays of radiant energy digital signal elements;
    imaging means for outputting a planar two-dimensional output array of radiant energy digital signal elements;
    wherein the radiant energy digital signal elements of the first and second input arrays and the output array are arranged in ordered rows and columns within each respective array and wherein elements of the aforementioned three arrays at the same row and column position are in correspondence; and
    means responsive to the means for inputting the first and second input arrays and feeding the outputting means for deriving the digital states of the elements of the output array based on the digital states of the corresponding elements of the input arrays.

30. The device of claim 29 wherein said inputting and outputting means each comprise a plurality of radiant energy conduits, one for carrying each radiant energy element.

31. The device of claim 29 wherein each mentioned radiant energy is optical energy and wherein said digital state deriving means includes a rectangular array of ordered rows and columns of photoelectric transducer elements, said photoelectric transducer elements being positioned in receiving relationship to corresponding elements of the first input array, a two-dimensional rectangular array of electrodes having digital voltages excited by said photoelectric transducer array and means for transducing said electrode voltages to form the output optical array.

32. The device of claim 31 including first and second reference electrodes positioned for exciting said transducing means and wherein said electrode array is positioned between said first and second reference electrodes for selectively shielding said transducing means from excitation.

33. The device of claim 31 wherein said transducing means comprises an electro-optic material having an optical property varied by said electrode voltages, said second input array being coupled to said electro-optic material and said output array being coupled to said electro-optic material in a manner whereby the optical energy in elements of said input optical array is coupled to corresponding elements of said output array dependent on said optical property.

34. The device of claim 33 wherein said electro-optic material is a liquid crystal.

35. The device of claim 34 wherein said optical property is transparency and wherein said second input optical array and said output optical array are coupled to opposite sides of said liquid crystal.

36. The device of claim 34 wherein said optical property is reflectivity and wherein said second input optical array and said output optical array are coupled to the same side of said liquid crystal.

37. The device of claim 31 including a second array of ordered rows and columns of photoelectric transducer elements positioned in receiving relationship to corresponding elements of the second input array, corresponding photoelectric elements, positioned at the same row and column, of the first mentioned and the second photoelectric transducer arrays being coupled together for exciting said transducing means.

38. The device of claim 37 wherein said transducing means comprises an array of electrically excitable discrete light sources.

39. The device of claim 38 wherein said discrete light sources are light emitting diodes.

40. The device of claim 37 wherein said transducing means comprises a distributed array of electrically excitable light sources.

41. The device of claim 40 wherein said distributed array is an electroluminescent material.

42. The device of claim 40 wherein said distributed array is a phosphor.

43. The device of claim 42 including a source of electron space charge, said space charge source and said electrode array being relatively positioned so that electrons from the source are adapted to be accelerated to the phosphor dependent on the electrode voltages.

44. A digital optical array inverter device comprising:
    a rectangular two-dimensional input array of ordered rows and columns of optical conduits;
    a rectangular two-dimensional output array of ordered rows and columns of digital radiant energy conduits;
    wherein optical energy present in a conduit corresponds to a digital one and radiant energy absent in a conduit corresponds to a digital zero and wherein input and output conduits at the same row and columns are in correspondence; and
    controllable optical source means responsive to digital zeros in the input conduits for supplying digital one optical energy to said output conduits.

45. The inverter device of claim 44 wherein said controllable optical source means comprises a distributed optical source.

46. A radiant energy logic device comprising:
    a rectangular input array of ordered rows and columns of pairs of input aperture means adapted to receive radiant energy digital signals;
    a rectangular output array of ordered rows and columns of output aperture means, adapted to transmit radiant energy digital signals; and
    logic means interposed between said input array and said output array for exciting the output aperture means at each row and column position with radiant energy digital signals dependent on the digital states of radiant energy in the input aperture means pairs at the same row and column positions.

47. The device of claim 46 further comprising surface means for receiving two separate radiant energy digital signal arrays, each signal array characterized by ordered rows and columns, means coupling said surface means to said input array in a manner where the radiant energy digital signals of the two signal arrays are coupled to the pair of input aperture means at the same row and column position as the signals of said signal arrays.

48. The device of claim 47 wherein said coupling means comprise conduit arrays, the conduits of said arrays forming the aperture means of said input surface.

49. The device of claim 46 wherein each output aperture means is larger in area than an input aperture means pair.

50. A radiant energy array device comprising: a first rectangular array of ordered rows and columns of aperture means;

a second rectangular array of ordered rows and columns of aperture means spaced a part from said first rectangular array;

a third rectangular array of ordered rows and columns of first and second aperture means each of said pairs of aperture means having a predetermined spatial relationship; and conduit means connecting each of the aperture means of the first and second arrays to the first and second aperture means of the third array, respectively at the same row and column positions.

51. The device of claim 50 wherein the aperture means of the first and second arrays are of a first size, the first and second aperture means of the third array are of a second size smaller than the first size and said predetermined spatial relationship is such that the first size encompasses first and second aperture means of the second size.

52. A radiant energy array device responsive to an input rectangular array of radiant energy digital signal elements arranged in ordered rows and columns comprising:

combiner means having a pair of input surface locations for receiving two separate radiant energy digital signal array inputs and having an output surface for outputting a radiant energy array;

duplicator means having an input surface coupled to said combiner means output surface and having a pair of output surface locations;

mask means for inputting only a predetermined portion of said input digital array to one of said combiner means input surface locations; and slider means being fed from one of said duplicator means output surface locations and feeding the other of said combiner means input surface locations.

53. The device of claim 52 wherein said combiner means includes OR means for forming the OR of the two separate radiant energy digital signal array inputs.

54. The device of claim 52 wherein said mask means comprises means for inputting only a column of said input rectangular array and wherein said slider means has a slide of one column.

55. The device of claim 52 wherein said mask means comprises means for inputting only a row of said input rectangular array and wherein said slider means has a slide of one row.

56. The device of claim 52 wherein said mask means comprises means for inputting only an element of said input rectangular array, wherein said slider means is fed by both said output surface locations, wherein said slider means comprises first means for sliding one column having a first output, second means for sliding one row having a second output; wherein said combiner means has three input surface locations and wherein the first and second outputs of the first and second means for sliding feed two of said combiner means input surface locations.

57. A radiant energy array device responsive to a rectangular two-dimensional input array of ordered rows and columns of radiant energy digital signal elements comprising:

combiner means having three input surface locations and an output surface;

duplicator means having an input surface coupled to said combiner means output surface and having three output surface locations;

means for inputting said input digital radiant energy array to one of said combiner means input surface locations;

first slider means, having a slide of one row, fed from one of said duplicator means output surface locations and feeding one of said combiner means input surface locations; and second slider means, having a slide of one column, fed from another of said duplicator means output surface locations and feeding another of said combiner means input surface locations.

58. The device of claim 57 wherein said inputting means comprises means for inputting only one signal element of said input digital array and wherein said first and second slider means comprise cyclical slider means.

59. A device for thresholding a input array of radiant energy analog signals comprising:

a radiant energy nonlinear amplifier means having first and second radiant energy array input locations and a radiant energy array output location, wherein said input and output array locations are characterized by ordered rows and columns of signal elements;

means for inputting said input analog radiant energy array to the first input location; and regenerative feedback means for coupling said output array location to the second input array location.

60. A digital radiant energy computer system comprising:

a source of digital radiant energy bit plane data, in the form of arrays, said arrays having rows and columns of array elements;

instruction register means for storing a plurality of radiant energy digital array bit planes each array having ordered rows and columns of radiant energy elements, the combination of digital states of each element of the bit planes at the same row and column position being indicative of an instruction to be performed on the data digital radiant energy bit data array elements at the same row and column position;

arithmetic means responsive to said data source for selectively performing a plurality of arithmetic operations on said digital radiant radiant energy array data; and instruction decoder means coupled to the instruction register for providing instructions mask radiant energy arrays to the arithmetic means indicative of which operations are to be performed on which positioned elements of said data bit plane arrays.

61. The system of claim 60 wherein said data source comprises a memory means for storing a plurality of bit plane arrays wherein a plurality of bit planes corresponds to a radiant energy image; and wherein said instruction register also comprises means for storing bit plane arrays having ordered rows and columns of radiant energy elements, the combination of the digital states of the bit planes at the same row and column being indicative of which memory image determines the data element at the same row and column position; and memory address decoder means coupled to instruction register means for providing memory mask radiant energy arrays indicative of which memory images are to supply which positioned elements of said data bit plane arrays.

62. A device responsive to an input two-dimensional array of spaced optical elements, each element being of a first size for converting said input array to an output array of substantially contiguous optical elements of a second size greater than the first comprising:
  means for inputting said array of spaced apart optical elements;
  an array of photoelectric transducer elements, said photoelectric transducer elements being positioned to be illuminated by said inputting means; and
  an output array of substantially contiguous controllable light sources of said second size positioned to be responsive to said photoelectric transducer elements.

63. The device of claim 62 wherein said inputting means comprises a two-dimensional array of spaced apart optical conduits.

* * * * *